(12) United States Patent
Glenn et al.

(10) Patent No.: US 6,268,654 B1
(45) Date of Patent: Jul. 31, 2001

(54) INTEGRATED CIRCUIT PACKAGE HAVING ADHESIVE BEAD SUPPORTING PLANAR LID ABOVE PLANAR SUBSTRATE

(75) Inventors: Thomas P. Glenn, Gilbert, AZ (US); Roy D. Hollaway, Paranaque (PH); Anthony E. Panczak, Sunnyvale, CA (US)

(73) Assignee: Ankor Technology, Inc., Chandler, AZ (US)

( * ) Notice: Subject to any disclaimer, the term of this patent is extended or adjusted under 35 U.S.C. 154(b) by 0 days.

(21) Appl. No.: 09/437,574

(22) Filed: Nov. 9, 1999

Related U.S. Application Data

(60) Division of application No. 09/050,666, filed on Mar. 30, 1998, now Pat. No. 6,117,705, which is a continuation-in-part of application No. 08/844,536, filed on Apr. 18, 1997, now Pat. No. 6,034,429.

(51) Int. Cl.[7] .................................................. H01L 23/053
(52) U.S. Cl. ..................... 257/704; 257/701; 257/702; 257/710
(58) Field of Search ................................... 257/701, 702, 257/704, 710

(56) References Cited

U.S. PATENT DOCUMENTS

| | | | |
|---|---|---|---|
| 4,159,221 | 6/1979 | Schuessler | 156/285 |
| 4,530,152 | 7/1985 | Roche et al. | 29/588 |
| 4,890,383 | 1/1990 | Lumbard et al. | 437/226 |
| 5,001,829 | 3/1991 | Schelhorn | 29/840 |
| 5,043,004 | 8/1991 | Miyauchi | 65/32.2 |

(List continued on next page.)

FOREIGN PATENT DOCUMENTS

| | | | |
|---|---|---|---|
| 0 721 212 A1 | 7/1996 | (EP) | H01L/23/055 |
| 6-209639 | 1/1987 | (JP) | |
| 4-360576 | 12/1992 | (JP) | H01L/27/14 |

OTHER PUBLICATIONS

Patent Abstracts of Japan, vol. 25, No. 230 (E–1361), May 11, 1993 & JP 4360576 A, NEC Corp., Dec. 14, 1992.

Banerji, K., "Development of the Slightly IC Carrier (SLICC)", *Technical Program NEPCON WEST '94*, Feb. 27–Mar. 4, 1994, pp. 1249–1256.

(List continued on next page.)

*Primary Examiner*—Richard Booth
*Assistant Examiner*—David A Zarneke
(74) *Attorney, Agent, or Firm*—Skjerven Morrill MacPherson LLP; James E. Parsons

(57) ABSTRACT

A package for an integrated circuit is described, as are methods of making the package. The package includes a substrate having a generally planar first surface on which a metal die pad is formed. An integrated circuit die is attached to the metal die pad. An adhesive head surrounds the integrated circuit die and covers the exposed periphery of the metal die pad. A generally planar lid is in a press-fitted interconnection with the bead. An adhesive material covers conductive structures on the die, such as bonding pads, to prevent corrosion. Optionally, the package has vertical peripheral sides. The methods of making the package include methods for making packages individually, or making a plurality of packages simultaneously. Where a plurality of packages are made simultaneously, integrated circuit die are placed on each of a plurality of physically-joined package substrates on a generally planar sheet of substrate material. An adhesive bead is applied around each die. In cross-section, the bead has a central peak and a shorter peak on each side of the central peak. A sheet of lid material is placed onto the beads. After the bead is hardened, individual packages are formed by cutting the substrate sheet, lid sheet, and beads.

28 Claims, 11 Drawing Sheets

U.S. PATENT DOCUMENTS

| | | | |
|---|---|---|---|
| 5,102,829 | 4/1992 | Cohn | 437/217 |
| 5,105,260 | 4/1992 | Butera | 357/74 |
| 5,126,818 | 6/1992 | Takami et al. | 357/68 |
| 5,192,681 | 3/1993 | Chiu | 437/217 |
| 5,230,759 | 7/1993 | Hiraiwa | 156/69 |
| 5,241,133 | 8/1993 | Mullen, III et al. | 174/52.4 |
| 5,250,470 | 10/1993 | Yamaguchi | 437/211 |
| 5,278,429 | 1/1994 | Takenaka et al. | 257/678 |
| 5,336,931 | 8/1994 | Juskey et al. | 257/787 |
| 5,414,300 | 5/1995 | Tozawa et al. | 257/704 |
| 5,422,615 | 6/1995 | Shibagaki et al. | 333/246 |
| 5,436,203 | 7/1995 | Lin | 437/209 |
| 5,474,957 | 12/1995 | Urushima | 437/209 |
| 5,578,525 | 11/1996 | Mizukoshi | 437/206 |
| 5,593,926 | 1/1997 | Fujihara | 437/209 |
| 5,641,713 | 6/1997 | Kyle | 156/330 |
| 5,742,007 | 4/1998 | Kornowski et al. | 174/52.3 |
| 5,776,798 | 7/1998 | Quan et al. | |
| 5,801,074 | 9/1998 | Kim et al. | 438/125 |
| 5,950,074 | 9/1999 | Glenn et al. | 438/121 |
| 6,034,429 | 3/2000 | Glenn et al. | 257/701 |

OTHER PUBLICATIONS

Patent Abstracts of Japan, vol. 011, No. 304 (E–545), Oct. 3 1987 and & JP 62 097355 A, *Toshiba Corp*, May 6, 1987.

Levine et al., "The Package", *Electronic News*, vol. 42, No. 2112, 1996, pp. 1, 32.

R.F. Kilburn et al., "Printed Circuit Module Assembly", *IBM Technical Disclosure Bulletin*, vol. 25, No. 4, Sep. 1982, pp. 1803, XP002107769.

Patent Abstracts of Japan, vol. 096, No. 012, Dec. 26 1996, and JP 08 213498 A, *Sumitomo Kinzoku Electro Device: KK*, Aug. 20, 1996.

US 6,268,654 B1

INTEGRATED CIRCUIT PACKAGE HAVING ADHESIVE BEAD SUPPORTING PLANAR LID ABOVE PLANAR SUBSTRATE

This application is a divisional of 09/050,666, now U.S. Pat. No. 6,117,705, filed on Mar. 30, 1998; which is a CIP of 08/844,536, now U.S. Pat. No. 6,034,429, which was filed on Apr. 18, 1997.

FIELD OF THE INVENTION

The present invention relates to integrated circuit packages, and in particular to a low cost, integrated circuit package.

BACKGROUND OF THE INVENTION

A goal in packaging integrated circuits is to reduce the cost and difficulty of manufacturing reliable packages. This goal is particularly present in packaging erasable programmable read-only memory devices ("EPROM"), charge coupled devices ("CCD"), and the like. Each such device requires a transparent package surface above the die, such as a quartz window, which increases manufacturing cost and difficulty.

A conventional package for an EPROM device, for example, has a ceramic base and an opposing ceramic lid. The base and/or lid have central depressions. When the base and lid are opposed, the depression(s) define a cavity for the die. The ceramic portions of the base and lid form the sides of the package. The lid has an aperture into which a glass or quartz window is fitted. A conductive metal lead frame is sandwiched between the base and lid. The leads of the lead frame perforate the sides of the package, extending laterally into and away from the cavity. Inside the cavity, the leads are connected to the die by bond wires. Thin layers of frit seal glass bond the base and lid to the lead frame and thus to each other.

Such packages have cost disadvantages, such as the need for a two-piece lid and a lead frame permeating the sides of the package. These and other cost and manufacturability disadvantages are also present in other EPROM packages, such as those shown in U.S. Pat. Nos. 5,043,004 and 5,192,681.

SUMMARY OF THE INVENTION

The present invention includes a package enclosing one or more integrated circuit die, and a method for making such a package. The package is useful, for example, in SAW, EPROM and CCD applications.

A package in accordance with one embodiment of the invention has an insulating substrate as a base upon which a die is placed; an imperforate adhesive bead surrounding the die as the package sidewalls; and a lid, centered over and spaced above the substrate and die, in press-fitted interconnection with the bead.

The substrate has a substantially planar first surface upon which at least one integrated circuit die is placed, and an opposing second surface. Conductive structures on the substrate, and conductive vias through the substrate, provide electrical connectivity between the die and external circuitry.

The imperforate adhesive bead is applied onto the first surface of the substrate. The bead surrounds the integrated circuit die. The bead is initially viscous, but is hardenable into a solid. Epoxy material or an equivalent such as silicone or a blend of such materials is used for the bead.

The lid is plastic or ceramic for surface acoustical wave ("SAW") package applications. Alternatively, for EPROM or CCD applications, the lid is transparent, at least in part, to a selected electromagnetic radiation, such as ultraviolet, visible, or infrared light. Boro-silicate glass is suitable. The lid has a first surface that faces and is spaced above the first surface of the substrate and the integrated circuit die. A peripheral portion of the first surface of the lid is in a press-fitted interconnection with the bead.

The lid has an edge at its perimeter which is also in press-fitted interconnection with the bead. The lid's edge has perpendicular, or alternatively, a sloped orientation, relative to the first and/or second surfaces of the lid. All or part of the edge portions are in press-fitted interconnection with the bead.

One embodiment of a method of making such a package involves a first step of providing a substrate, such as described above, having a substantially planar first surface and at least one conductive structure on that first surface, and placing at least one integrated circuit die on the first surface of the substrate. The integrated circuit die is electrically connected to one or more of the conductive structures on the first surface of the substrate. A viscous, hardenable, adhesive material, such as epoxy, is applied on the first surface of the substrate to form an imperforate bead around the integrated circuit die(s). The bead extends to a height above the first surface of the substrate which is greater than the height of the integrated circuit die above the substrate.

A lid is also provided. For EPROM or CCD applications, at least part of the lid is transparent to electromagnetic radiation, for example, infra red, ultraviolet, or visible light. For example, a flat, one piece boro-silicate glass lid is used.

The lid is placed onto the bead while the bead is still viscous, so that the first surface of the lid is facing, centered over, and spaced above the first surface of the substrate and the integrated circuit die. A peripheral portion of the first surface of the lid makes contact with the top surface of the bead. The lid is then press-fit into the bead, such as by mechanical pressing. All or part of the edge of the lid is also press fit into the bead, so that the bead material contacts all or part of the edge of the lid. The bead is then hardened, such as by heating the package.

In an alternative method embodiment, a viscous material is applied to the first surface of the substrate to form an imperforate bead substantially around the integrated circuit, leaving at least one discontinuity, e.g., a gap. Additional viscous adhesive material is then applied to the package, after the lid is placed onto and press-fitted into the bead and after the bead partially hardens, to fill any gaps in the bead. The adhesive bead is an epoxy material or equivalent, and the lid is a flat, one-piece boro-silicate glass plate.

An alternative embodiment of the package includes an integrated circuit which is attached to a metal die pad on the planar first surface of a substrate. The metal die pad extends laterally beyond the entire perimeter of the integrated circuit die. The package also has a conductive path which passes through the substrate for conducting an electrical signal(s) between a conductive structure on the integrated circuit die, such as a bonding pad(s), and a conductive structure on the second surface of the substrate, such as an interconnection ball(s). The bonding pads are covered with a nonconductive adhesive material to prevent corrosion. A nonconductive adhesive bead on the first surface of the substrate surrounds the integrated circuit die and covers a peripheral portion of the metal die pad around the entire perimeter of the metal die pad. A lid having a planar first surface is placed on and connected to the adhesive bead around the integrated circuit die and is supported above the first surface of the substrate and the integrated circuit die by the bead. optionally, the package has vertical peripheral sides around the entire package The placement of the bead relative to the integrated circuit die may vary. In one embodiment, the adhesive bead contacts all sides of the die and covers a peripheral portion of the first surface of the integrated circuit die around the entire perimeter of the integrated circuit die. In this embodiment, the adhesive bead, rather than a separate adhesive coating, covers the conductive structures, such as bonding pads, on the first surface of the integrated circuit die. The adhesive bead also may cover bond wires or other types of conductive structures which are attached to bonding pads.

A method of making a plurality of integrated circuit die simultaneously is also described. A first step includes providing a generally planar first sheet of an insulating material suitable for forming package substrates. The first sheet of substrate material has a plurality of physically-joined package substrates in a matrix. Each package substrate has a planar first surface in a common plane. A second step is placing an integrated circuit die on a metal die pad formed on the first surface of each package substrate of the first sheet. A third step is electrically connecting a conductive structure, such as a bonding pad, on each of the die to a conductive path that passes through each die's respective package substrate. A fourth step is applying an adhesive bead onto each package substrate of the first sheet around each integrated circuit die. The bead covers a peripheral portion of the metal die pad around the die. In cross-section, one embodiment of the adhesive bead has a central peak and a shorter peak on each side of the central peak. A fifth step is providing a generally planar second sheet of a material, such as plastic, ceramic, or glass, suitable for forming a lid for each package. The area of the second sheet should be sufficient to cover the adhesive beads around all of the integrated circuit dies. A sixth step is placing and pressing the first surface of the second sheet of lid material onto the adhesive bead around each of the dies such that the first surface of the second sheet is supported above the first surfaces of the package substrates of the first sheet and the integrated circuit dies by the adhesive beads. A seventh step is to harden the beads. Finally, an eighth step is to separate the individual package substrates of the first sheet and cutting the second sheet such that individual packages each having a package substrate, an enclosed integrated circuit die, and a lid are formed. The eighth step can be performed so that each package is the same size and has vertical peripheral sides around the entire package.

One embodiment of the step of applying an adhesive bead around each die is to apply single bead between adjacent integrated circuit die of adjacent package substrates of the first sheet. During the step of separating the individual package substrates of the first sheet and the second sheet, such single beads are split between two adjacent packages.

An advantage of the packages and methods of the present invention includes a significant reduction in manufacturing cost compared to conventional EPROM, CCD, or similar packages. Another advantage is a reduction in manufacturing difficulties.

DETAILED DESCRIPTION

In the figures, where similar structures are present in more than one figure, the same reference numbers are used for each such structure in each such figure.

Figure 1:
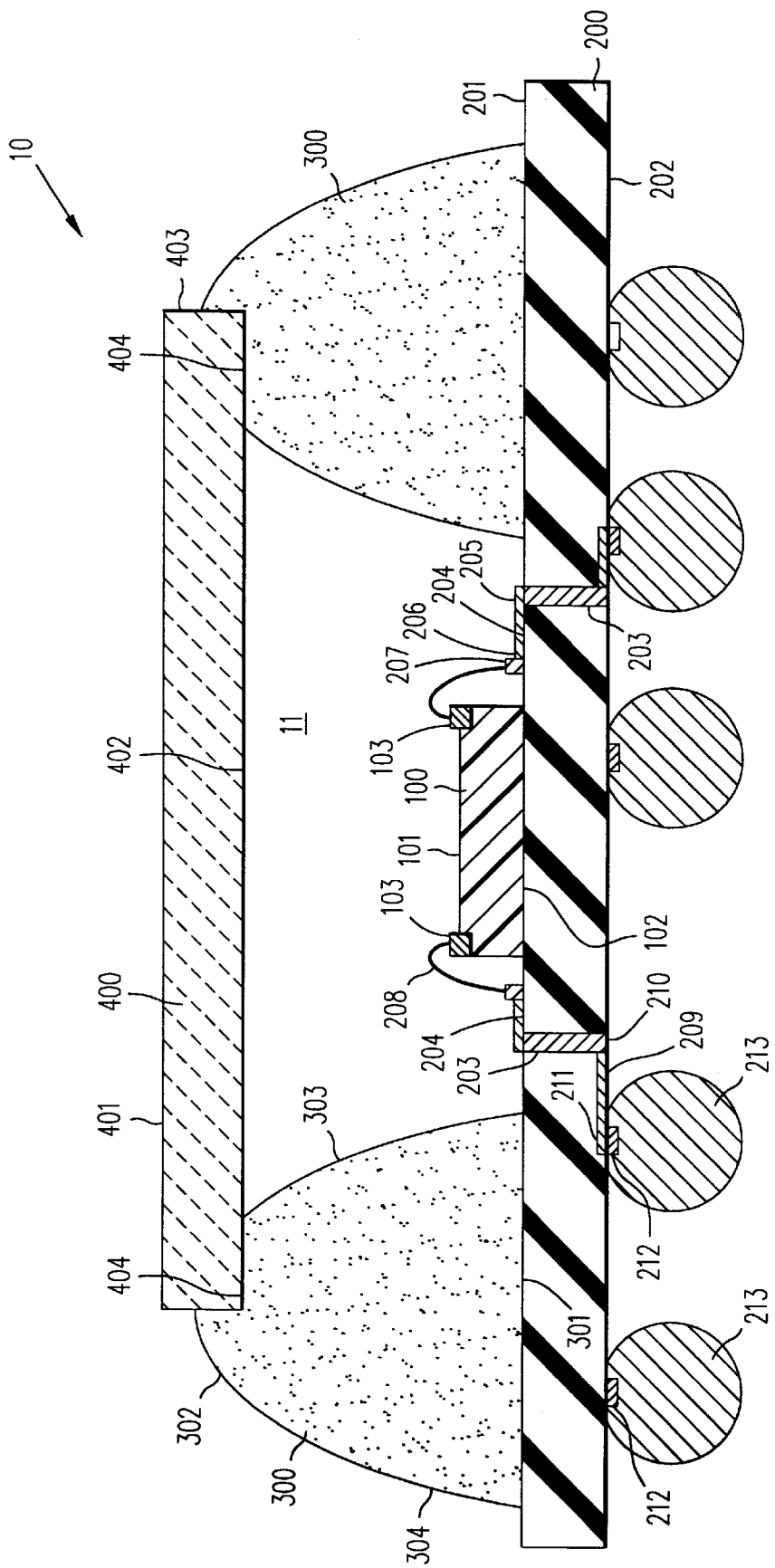
FIG. 1 is a cross sectional view of a package.

FIG. 1 shows a cross section of an embodiment of a package in accordance with the present invention. Within package 10 is a package cavity 11. Within cavity 11 is an integrated circuit die 100. In an alternative embodiment, a plurality of die are contained in one package.

Die 100 has an upper surface 101 and a lower surface 102. Die 100 has a height between upper surface 101 and lower surface 102, a width, and a length. An exemplary size for an integrated circuit die is $(0.012\pm0.003)\times(0.200$ to $0.500)\times(0.200$ to $0.500)$ (H,W,L) inches, but the sizes of dies vary.

Die 100 has a plurality of bonding pads 103 on its upper surface 101. These pads are electrically connected to the internal electronic components (not shown) of die 100. Among other things, package 10 provides a protective enclosure or housing for die 100, and conductors for electrically connecting die 100 to external circuitry.

In FIG. 1, die 100 is placed on and attached to substrate 200, which forms a base for package 10. Substrate 200 has an upper surface 201 and a lower surface 202. Both upper surface 201 and lower surface 202 of substrate 200 have an area and a perimeter.

Figure 2A:
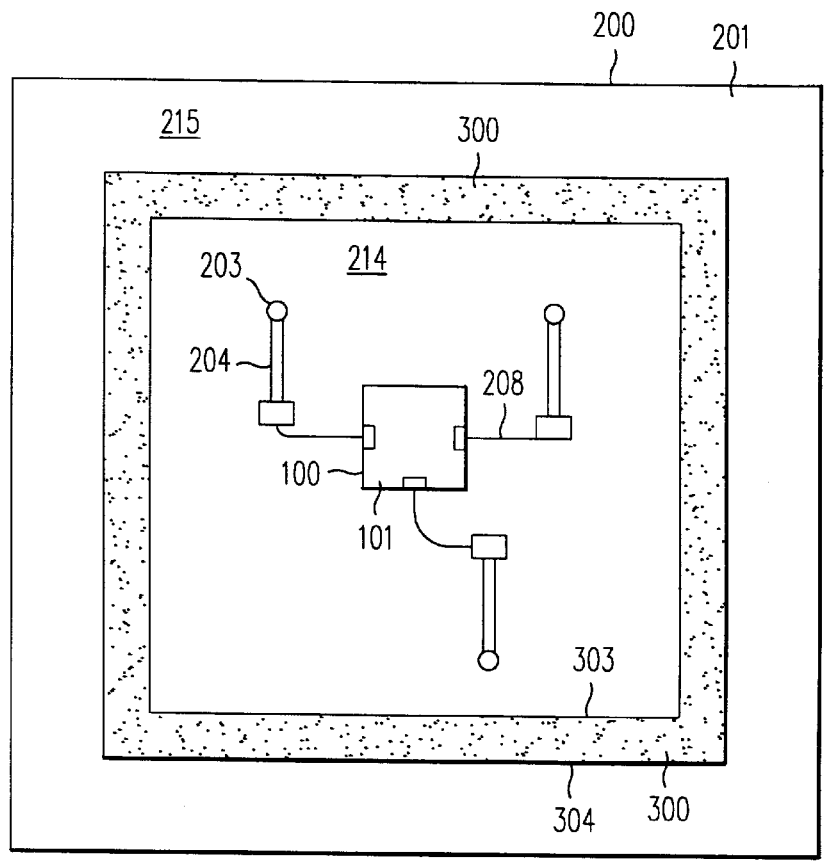
FIGS. 2A and 2B are top views of an incomplete package prior to placing the lid on the bead.

Substrate 200 may have various perimeter shapes, such as a square, rectangle, or circle. In FIG. 2A, for example, substrate 200 is square.

Both upper surface 201 and lower surface 202 of substrate 200 are substantially planar. For example, in the embodiment of FIG. 1, both upper surface 201 and lower surface 202 of substrate 200 are flat.

The size of substrate 200 may vary depending on the application. For example, a larger die typically requires a larger base than a smaller die.

Substrate 200 is comprised of an insulating material, such as a laminate. Alternatively, substrate 200 is of ceramic or insulated metal. Examples of suitable laminate substrates from widely-known vendors include Mitsubishi-BT, Arlon 45N, and Nellco BT.

Die 100 is placed on upper surface 201 of substrate 200 with, for example, a conventional die attach machine, such as the Alpha Sem 9006 from the Alpha-Sem Corporation of Switzerland, or an equivalent. Hand placement may also be used. Die 100 is attached to upper surface 201 with a conventional adhesive epoxy, such as QMI-595 from Quantum Materials, Inc. of San Diego, Calif.

Package 10 includes electrical conductors for electrically connecting die 100 to external circuitry. There are several ways to provide such connectivity. In FIG. 1, for example, substrate 200 includes electrically conductive vias 203 through substrate 200, between upper surface 201 and lower surface 202. For clarity, only two such vias are shown in FIG. 1, but in general a substantial number of such vias are formed, as required. Such vias may be formed, for example, by drilling holes in substrate 200, and plating the drilled holes with metal, such as copper.

In FIG. 1, additional conductors are formed on upper surface 201 and lower surface 202 of substrate 200. For example, one or more electrically conductive metalizations 204 may be formed on upper surface 201. For clarity, only two are shown in FIG. 1, but as many such metalizations may be formed on surface 201, as required. Such metalizations are formidable of copper where a laminate substrate is used. Alternatively, if a ceramic substrate is used, such metalizations may be formed of tungsten.

Referring to FIG. 1, each metalization 204 is electrically connected on a first end 205 to a conductive via 203, and on a second end 206 to a conductive contact 207. Contact 207 is, in one embodiment, of layered gold, or alternatively, of nickel and gold.

Contact 207 is electrically connected by a conductive metal bond wire 208 to one of the bonding pads 103 on die 100. As an example, bond wire 208 is formed of gold. Alternatively, instead of using bond wires, die 100 is electrically connected to conductive structures on substrate 200 using tape automated bonding.

Lower surface 202 of substrate 200 also has one or more conductive features for electrically connecting die 100 to external circuitry. In the example of FIG. 1, a plurality of electrically conductive traces or metalizations 209 are shown on lower surface 202 of substrate 200. For clarity, only two such metalizations are shown in FIG. 1, but there may be as many as required. Copper is usable for these metalizations. Metalization 209 is electrically connected on a first end 210 to a via 203, and on a second end 211 to a contact 212, which is similar to contact 207.

The conductive features on lower surface 202 of substrate 200 are arranged in a pattern to match up with and connect to external circuitry (not shown). In FIG. 1, for example, solder balls 213 are formed on contacts 212 on lower surface 202 of substrate 200. This arrangement forms a ball grid array ("BGA") package. In an alternative embodiment, instead of using interconnection balls 213, contacts 212 are the electrical connection points for external circuitry, as in a leadless chip carrier ("LCC"). Alternatively, wire leads together with eutectic solder or metal clips may be used in place of interconnection balls.

Metalizations 204 and 209 may be formed in a conventional manner, for example, by masking and etching copper or other conductive layers formed on substrate 200. Contacts 207 and 212 may be formed using conventional processes such as electroplating or electrodeless chemical plating.

Referring again to FIG. 1, adjacent to and around die 100 on upper surface 201 of substrate 200 is an imperforate bead 300. Bead 300 has a lower portion 301 adhesively contacting upper surface 201 of substrate 200; an upper portion 302 in press-fitted interconnection with a peripheral portion and edge of lid 400; an inner portion 303 facing die 100; and an outer portion 304 facing away from die 100.

Bead 300 is formed of a material that is adhesive. The material of bead 300 should be somewhat viscous and flowable when initially applied to substrate 200 and when lid 400 is placed on and press fitted into bead 300. The material of bead 300 must be hardenable, however, such as by self-curing, heating, or application of ultraviolet light, so that bead 300 may ultimately form a solid package sidewall around die 100. As an example, bead 300 is comprised of an epoxy material, such as Hysol 4451, 4323, or 4328 from the Dexter/Hysol Corp. of City of Industry, Calif. Alternatively, an equivalent material such as silicone from the Dow Corning Company may be utilized for bead 300. As another example, blends of such materials may also be utilized for bead 300.

FIG. 2A is a top view of die 100 on upper surface 201 of substrate 200, before the placement of lid 400 onto bead 300. Bead 300 is shown in the form of a continuous, square, imperforate dam surrounding die 100. An inner portion 214 of upper surface 201 of substrate 200 is shown within bead 300, and an outer portion 215 of upper surface 201 of substrate 200 is shown without bead 300. In an alternative embodiment, outer portion 215 of substrate 200 may be formed (such as by trimming or molding) so that the perimeter of substrate 200 is more flush with outer portion 303 of bead 300.

Figure 2B:
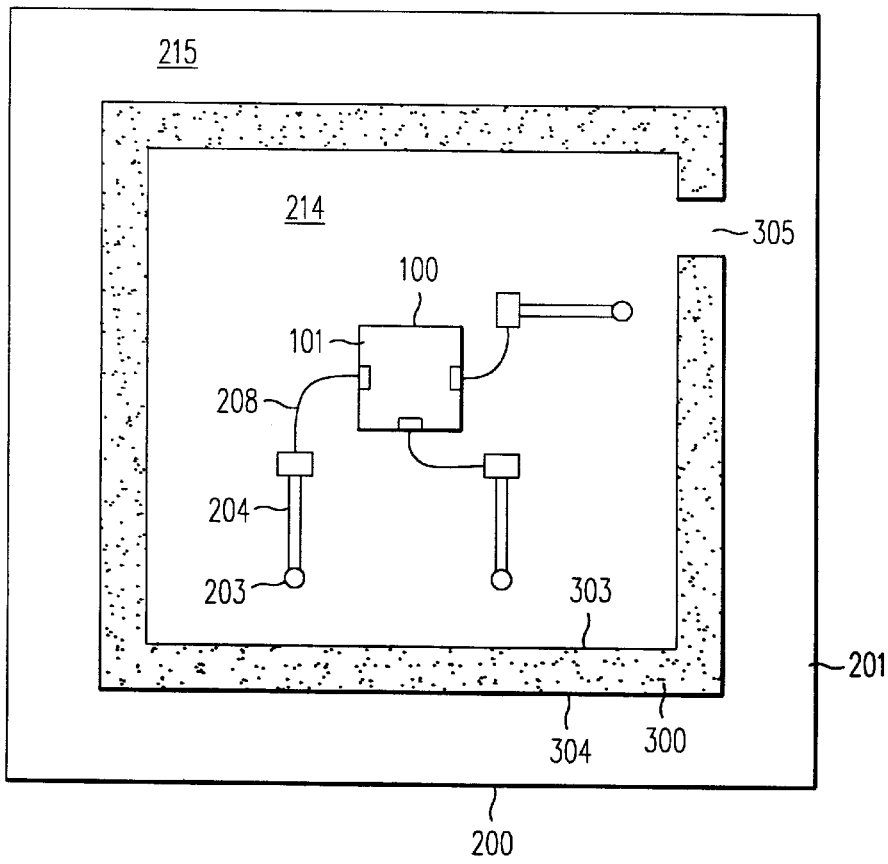

FIG. 2B shows an alternative embodiment where bead 300 is shown in the form of a square, imperforate dam substantially, but not fully, around integrated circuit die 100. Bead 300 has a discontinuity, exemplified by gap 305, which is discussed further below. The term "gap" is used generically. For example, there could be an equivalent dip in the bead. A function of gap 305 is to allow gases to escape the package cavity during hardening. Bead 300 surrounds a majority of the perimeter of die 100.

The path of imperforate bead 300 about die 100 may be varied. For example, instead of a square shape, as shown in FIG. 2A, the path of bead 300 about die 100 may be rectangular or circular. The lateral distance between bead 300 and die 100 may also be varied, depending on the size of die 100 and the desired size of package 10.

An epoxy or equivalent bead may be applied onto upper surface 201 of substrate 200 using a syringe or a conventional epoxy dam writer, such as is available from the Camelot Company or the Asymtek Company.

When an epoxy bead is initially being applied to upper surface 201 of substrate 200, the cross section shape of the epoxy is approximately circular as it comes out of the dam writing machine. An example diameter is approximately 0.030 to 0.045 inches, but the size of the diameter and/or other cross sectional shape of the bead will vary depending on the application. Being viscous and flowable, the epoxy settles into an imperforate domed-shaped dam, as is depicted for bead 300 in FIG. 1.

The height of bead 300 above upper surface 201 of substrate 200, when bead 300 is initially applied to upper surface 201 and before lid 400 is placed onto bead 300, should exceed the height of die 100 and bond wires 208 above upper surface 201 of substrate 200. This may be accomplished, for example, by appropriate selection of the amount of bead material and/or the cross section size of the bead material as it comes out of the syringe or dam writing machine.

Lid 400 forms the top of package 10. In the embodiment of FIG. 1, lid 400 has an upper surface 401, which forms the topmost outer surface of package 10, and a lower surface 402, which is spaced above, centered over, and facing upper surface 401 and die 100. Both upper surface 401 and lower surface 402 of lid 400 have an area and a perimeter. Lid 400 also has an edge 403 at its perimeter, that is, between the perimeter of upper surface 401 and the perimeter of lower surface 402 of lid 400.

The shape and size of lid 400 may be varied depending on the application. Lid 400 is substantially planar. In the embodiment of FIG. 1, upper surface 401 and lower surface 402 of lid 400 are flat. Alternatively, one or both of these lid surfaces may be concave.

The perimeter shape of lid 400 may be, for example, square, rectangular, or circular. The thickness of lid 400 varies, depending on the integrated circuit application and the material selected for lid 400. A typical thickness for lid 400, as exemplified in FIG. 1, is between about 0.02 to 0.04 inches.

Figure 3:
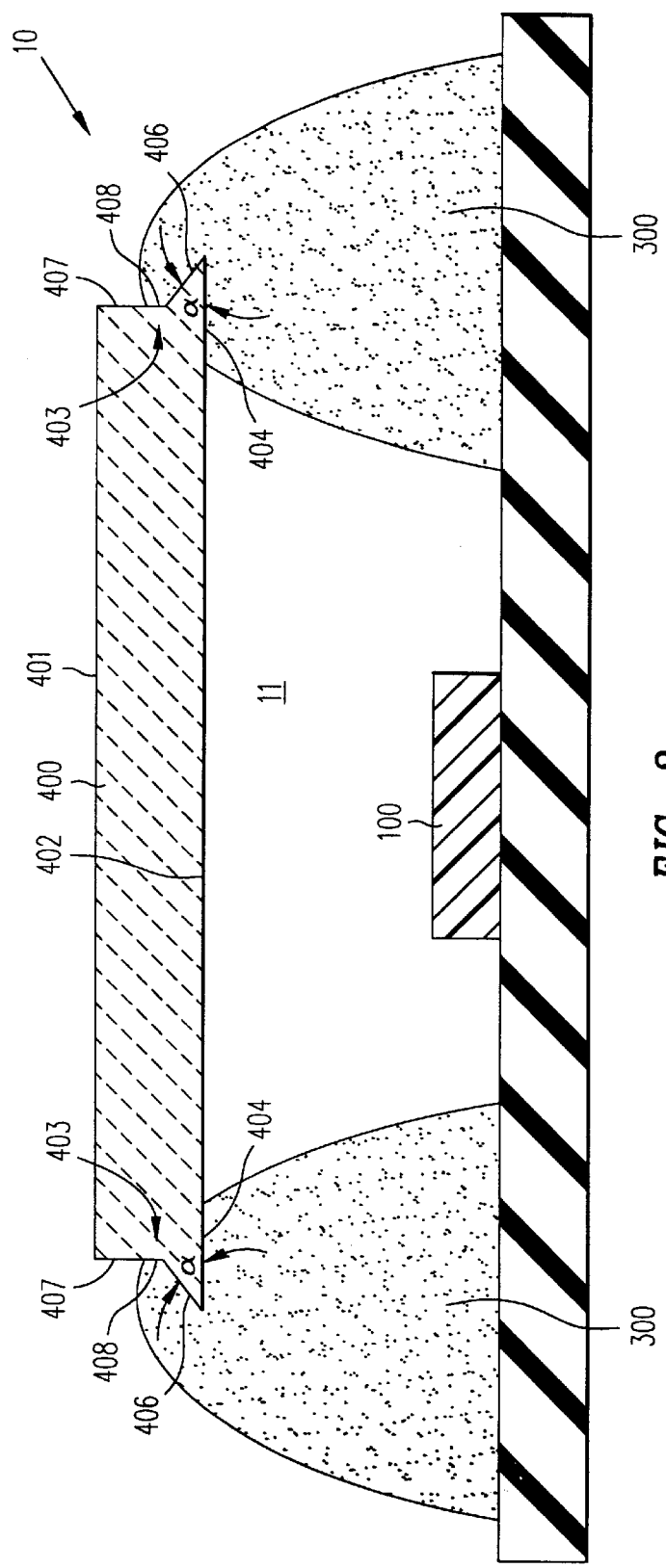
FIG. 3 is a cross sectional view of a lid showing the lid's edge.

The perimeter size of lid 400 may be varied, for example, to reflect the size of the die or dies packaged in package 10. For example, a typical size for a square lid may be 0.300× 0.300 inches. In the embodiments of FIGS. 1 and 3, the lid is sized so that, at the time of placement of lid 400 onto bead 300, the perimeter of the lid coincides with the lateral mid-point of the upper surface of bead 300.

Lid 400 may be formed of a variety of conventional materials, depending on the device being packaged. In one embodiment, the material of lid 400 is sufficiently light in weight that lid 400 rests atop bead 300 after placement thereon without sinking into the still-viscous material of bead 300.

The material of lid 400 is selected in part by the desired application of package 10. For surface acoustical wave device packages, the lid is ceramic, plastic, or another suitable material. For EPROM, CCD or similar devices, the functioning of the device requires a selected or continuous application of a selected electromagnetic radiation through the package to a surface of the die. For such applications, lid 400 is comprised, in whole or part, of a material that is transparent to the particular type, frequency, and/or amount of electromagnetic radiation needed by the packaged device. In an EPROM, as one example, light is used to erase data stored in an erasable memory.

In typical EPROM or CCD applications, all or part of lid 400 would be transparent to light, such as infrared, visible, or ultraviolet light, but when light was not desired to strike the die, the lid 400 would be covered with an opaque material such as opaque tape.

In the embodiment of FIG. 1, lid 400 is a one-piece structure, formed entirely of a material transparent to such light, such as glass. In particular, a flat, one-piece plate of boro-silicate glass having a thickness of 0.02 inches is useable for lid 400. Alternatively, other optically pure materials, such as quartz, diamond, or sapphire, may also be used to form all or part of lid 400. Lid 400 may also be a lens.

In assembling package 10, as depicted in FIGS. 1 and 2A, lower surface 402 of lid 400 is placed squarely onto upper portion 302 of bead 300, centered opposite and above upper surface 201 of substrate 200 and die 100, while the epoxy or other material comprising bead 300 is still flowable and before the bead is hardened into a solid sidewall. The amount of time before bead 300 hardens, and the steps involved in hardening the bead, vary with the material selected for the bead.

In FIGS. 1 and 2A, a peripheral portion 404 of lower surface 402 of lid 400 evenly contacts upper portion 302 of bead 300 about the entire path of bead 300 around integrated circuit die 100. Example paths are shown in FIGS. 2A and 2B.

A method of placing lid 400 onto upper portion 302 of bead 300 is to use a die attach machine, such as the Alpha Sem 9006 or equivalent. Alternatively, hand placement may be used.

After the step of placing lid 400 onto bead 300, and while the material of bead 300 is still viscous, lid 400 is press fitted into bead 300. In one embodiment, this press fitting step is accomplished by mechanical pressing. A partially assembled package 10, with lid 400 atop bead 300, is placed between two parallel plates of a pressing machine. The lower plate of the pressing machine is fixed, and the upper plate moves in a direction perpendicular to the plates. Lower surface 202 of substrate 200 rests on the lower plate. The upper plate moves downward toward the lower plate and contacts upper surface 401 of lid 400. The upper plate may be, for example, approximately the size of lid 400, or a different size. The upper plate of the pressing machine presses lid 400 into dam 300 with a light downward force, for example, a 50 gram force. Because the upper and lower plates of the pressing machine are parallel, this pressing causes lid 400 to move into dam 300 while at the same time aligning upper surface 401 of lid 400 parallel to lower surface 202 of substrate 200. The downward pressing of the upper plate of the pressing machine stops at a selected distance that is equal to the desired height of the package. A sensor detects when the space between the plates reaches the targeted spacing, and stops the downward travel of the upper plate of the pressing machine. The downward travel of the upper plate, after contacting the lid, may be, for example, 0.004 inches, but that distance varies depending on the package application.

The action of the pressing machine described above is similar to the action of conventional tools used to perform trim and form steps during the manufacture of plastic quad flatpack packages or other lead frame packages. A suitable press machine may be created by modifying such a trim and form machine with parallel plates having the pressing motion described herein.

During the above-described step of press fitting lid 400 into bead 300, the still-flowable material of bead 300 moves up and contacts all or part of edge 403 of lid 400. The material chosen for bead 300 should be sufficiently viscous at this point to flow up edge 403, but sufficiently thick to support and space lid 400 a distance above upper surface 201 of substrate 200 and die 100 and/or bond wires 208 until bead 300 is completely hardened.

During the placing and press-fitting steps, upper portion 302 of bead 300, along the entire path of bead 300, contacts and adheres to a peripheral portion 404 of lower surface 402 of lid 400. This contacting and adherence is along the entire path of bead 300 about die 100. Example paths are shown in FIGS. 2A and 2B. If the embodiment of FIG. 2B is used, the lid will not contact bead material in the area of the gap due to the lack of bead material.

During the press fitting step for an embodiment such as in FIG. 1, it is preferred that bead 300 contact and adhere to at least a lower portion of edge 403, beginning at the perimeter of lower surface 402 of lid 400 and extending up edge 403 in the direction of the perimeter of upper surface 401 of lid 400. Alternatively, bead 300 may contact and adhere to all of edge 403 of lid 400, up to and including the perimeter of upper surface 401 of lid 400. It is preferred that, when the material of bead 300 is hardened and the package is completed, bead 300 is in a press fitted interconnection with both peripheral portion 404 of lid 400 about the entire perimeter of lid 400 and all or part of edge 403 of lid 400. This enhances the attachment of lid 400 to bead 300.

After placement of lid 400 onto bead 300 and the press fitting of lid 300 into bead 300, the material of bead 300 is hardened to a solid. This hardening step may be performed in a variety of ways, depending on the material selected for bead 300. For example, certain epoxy materials harden with the application of heat or ultraviolet light. Upon the hardening of the material of bead 300, lid 400 is fixed in a press fitted interconnection with bead 300.

In the embodiments of FIGS. 1 and 2A, bead 300 surrounds die 100 and forms imperforate sidewalls of package 10. Bead 300 contacts, spaces, and secures lid 400 a distance above upper surface 201 of substrate 200. Preferably, bead 300 also spaces lid 400 a distance above die 100 and bond wires 208.

The spacing between substrate 200 and lid 400, or more particularly, between lower surface 402 of lid 400 and upper surface 201 of substrate 200, may be varied for particular device applications and package height requirements. This may be done, for example, by regulating the cross section size or shape of bead 300, the material of bead 300, the amount of press fitting of lid 400 into bead 300 before the step of hardening bead 300, or the amount of time before the hardening step. As an example, the final distance between lower surface 402 of lid 400 and upper surface 201 of substrate 200 may be in the range of about 0.02 to 0.04 inches, but the distance varies depending on the package application. If lid 400 is a lens, an alternative embodiment, then the spacing is more likely to be a critical dimension than in other applications.

The width of bead 300 between inner portion 303 and outer portion 304 will vary along its height, particularly if an epoxy material is used, because the initially viscous dam material will settle somewhat both inward and outward along upper surface 201 of substrate 200 after being applied to substrate 200 and before hardening. The press-fitting step will also cause dam 300 to spread.

Upon the completion of a package 10, as depicted in FIG. 1 and FIG. 2A, die 100 is fully enclosed in a closed three-dimensional cavity 11 defined by the intersections of substrate 200, bead 300, and lid 400. Substrate 200 forms the base of package 10; lid 400 opposite, centered, and spaced above substrate 200 and die 100 forms the top of package 10; and bead 300 forms the imperforate sidewalls of package 10 around die 100. Bead 300 is between and connected to substrate 200 and lid 400, and preferably is also in press-fitted interconnection with all or part of the edge of lid 400.

In certain applications, such as CCD devices, it may be desired that lid 400 be precisely parallel to upper surface 101 of die 100, and not appreciably tilted or cocked. In such applications, a process employing a bead as shown in FIG. 2B may be utilized. As the epoxy or other material comprising bead 300 is hardened, the air or other gases in cavity 11 of package 10 may expand and seek to escape. Referring to FIG. 2B, gap 305 in bead 300 provides a vent for the expanding air or gas to escape cavity 11, thus avoiding or reducing the possibility of any tilting of lid 400 which may be caused by the air or other gas in cavity 11 attempting to escape under or through bead 300 as bead 300 is hardened. Gap 305 is subsequently filled to enclose the die. Alternatively, gap 305 could serve as a port for introducing a selected inert gas or other fluid into cavity 11.

To construct the embodiment of FIG. 2B, bead 300 is applied to upper surface 201 of substrate 200 as described above, except that bead 300 is applied only partially around die 100. In FIG. 2B, bead 300 substantially surrounds die 100, except for a discontinuity, exemplified by gap 305, where the material of bead 300 is not present. An equivalent discontinuity could be formed, in an embodiment along the lines FIG. 2A, by providing a dip in upper portion 302 of bead 300. While the size and location of such discontinuities in bead 300 may be varied, bead 300 must surround enough of die 100 (e.g., a majority) to provide some support for lid 400 after lid 400 is placed onto bead 300 and before the hardening of bead 300.

After the placement and press fitting of lid 400 into bead 300, bead 300 is partially or fully hardened. Next, gap 305 (or equivalent dips or other discontinuities) of bead 300 is filled by an application of a viscous adhesive material between substrate 200 and lid 400, where bead material is lacking. If epoxy is used for bead 300, an epoxy such as Hysol 4323, which can stick to itself, is used to form bead 300. If bead 300 was only partially hardened before gap 305 was filled, any remaining gases escaping from cavity 11 of package 10 will bubble through the still-viscous material used to fill gap 305 until the entire bead is fully hardened.

This second application of adhesive material in the area of gap 305 may be performed with a dam writing machine or syringe. Alternatively, it may be done by hand. Afterwards, the additional adhesive material and/or the entire bead should be hardened into a solid, as discussed above. Upon the filling of gap 305 of bead 300 in FIG. 2B, die 100 will be fully enclosed in a closed three-dimensional cavity 11 defined by the intersections of substrate 200 (as the base), bead 300 (as the imperforate sidewall around die 100), and lid 400 (as the package top facing and above substrate 200 and die 100).

Employing the embodiment of FIG. 2B also provides a port for a selected inert gas or other substance to be introduced into package 10 prior to the final enclosure of die 100 by the filling or closing of gap 305. For example, an inert gas such as argon may be introduced into the package through the gap, so that cavity 11 would contain argon after gap 305 is closed. This step of introducing a selected gas may be done, for example, by placing the package of FIG. 2B in an argon atmosphere, allowing the argon gas to enter the cavity, and then applying a second application of bead material to the area of the gap, closing cavity 11 of package 10 and thus sealing in the argon. Of course, even with the embodiment of FIG. 2A, as discussed above, an inert gas or other selected substance may be introduced into package 10 by placing lid 400 onto bead 300 in a controlled atmosphere, such as in a hermetic chamber filled with argon gas.

The shape and orientation of edge 403 of lid 400 may be varied. For example, in FIG. 1, edge 403 of lid 400 is flat and its orientation is substantially perpendicular to the upper and lower surfaces of lid 400.

Alternatively, all or part of edge 403 of lid 400 may be provided with a lip or protrusion onto which the material of bead 300 can flow during the step of press fitting lid 400 into bead 300, to facilitate or enhance the locking and securing of lid 400 to bead 300.

FIG. 3 shows an example edge for lid 400. Edge 403 of lid 400 is shown with an upper portion 407 and a protruding sloped or diagonal lower portion 406. Upper portion 407 of edge 403 extends from the perimeter of upper surface 401 of lid 400 to a point 408 located a distance, here shown as midway, between upper surface 401 and lower surface 402 of lid 400. Upper portion 407 has a substantially perpendicular orientation with respect to upper surface 401 and lower surface 402 of lid 400, and to substrate 200. Lower portion 406 of edge 403 extends from point 408 to the perimeter of lower surface 402 of lid 400, and has a laterally outward and downward diagonal orientation with respect to upper surface 401 and lower surface 402 of lid 400, and cavity 11. The diagonal angle α of lower edge portion 406 of edge 403 is in the range of about 30 to 60 degrees, but may be varied.

With the embodiment of FIG. 3, after the placement of lid 400 onto bead 300 and during the press fitting of lid 400 into bead 300, whether by force of gravity or gravity and mechanical pressing, the still-flowable epoxy or other material comprising bead 300 will move up and cover all or part of the protrusion exemplified by diagonal lower portion 406 of edge 403. Alternatively, the material of bead 300 may cover all of lower portion 406 of edge 403 and contact all or part of upper portion 407 of edge 403. Upon hardening, the portion of the material of bead 300 in such a press-fitted interconnection with edge 403 aids the attachment between lid 400 and bead 300.

The profile, size, shape, or angle of edge 403 of lid 400 may be varied, while still accomplishing the enhanced attachment exemplified by the embodiment of FIG. 3. For example, edge 403 may alternatively have an "L" shape. As another example, instead of having an edge with an upper perpendicular portion 407 and a lower diagonal portion 406, as in FIG. 3, the entire edge 403 may be diagonal.

In the embodiment of FIG. 3, the entire perimeter of lid 400 has the edge shown in FIG. 3. For example, if lid 400 were square or rectangular, then all four sides would have the edge profile shown in FIG. 3. If lid 400 were circular, then the entire circumference would have the edge profile shown in FIG. 3. Alternatively, two sides of a square lid 400 could have the edge profile of FIG. 3, and two sides could have a perpendicular edge, as in FIG. 1.

As discussed above, lid 400 can be a flat, one-piece plate of boro-silicate glass for applications such as EPROM, CCD, or similar devices. Boro-silicate glass may be commercially purchased in sheets of various sizes, such as four inches by four inches. Depending on the desired size of the package 10, the sheet of boro-silicate glass may need to be cut to size.

In one method of assembling package 10, a flat sheet of boro-silicate glass is placed on a sheet of sticky paper, as is conventionally used when wafers are cut into individual dies. The glass sheet is then cut, using a wafer saw, to form the desired shape of lid. The boro-silicate glass sheet may be sawed in a bath of deionized water to assist in maintaining the cleanliness of the boro-silicate glass lids. After this cutting or shaping step, a conventional die attach machine is used to pick up each now-formed lid 400 from the sticky paper for placing the lid 400 onto upper portion 302 of bead 300.

Figure 4:
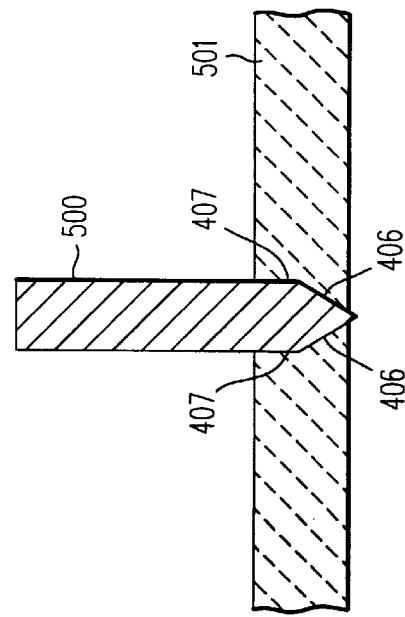
FIG. 4 shows a saw blade cutting a sheet of boro-silicate glass.

For the embodiment of FIG. 3, where lower portion 406 of edge 403 of lid 400 is provided with a diagonal laterally outward and downward protrusion, a conventional wafer saw with a tapered blade may be used to fashion edge 403. FIG. 4 shows a tapered saw blade 500 cutting a sheet 501 of the preferred boro-silicate glass. The portions of the blade that form the upper portion 407 and lower portion 406 of edge 403 of a lid 400 are shown. The lengths of upper portion 407 and lower edge 406 may be adjusted by raising or lowering the position of sheet 501 against blade 500. The diagonal angle of lower portion 406 of edge 403 may be adjusted by varying the taper of saw blade 501.

The above structures and methods may be used to create packages of varying sizes and shapes. Where a two inch by two inch square package is desired, for example, it may be most economical to construct the packages one at a time. If a smaller package is desired, for example, a 0.5 inch by 0.5 inch square package, it may be most economical to complete several packages on a single sheet of substrate material, as discussed above, and then cut the substrate sheet to separate the individual packages. In an alternative embodiment, a plurality of integrated circuit dies are placed on a single substrate base for assembly, according to the steps described above, in a single package.

Figure 5:
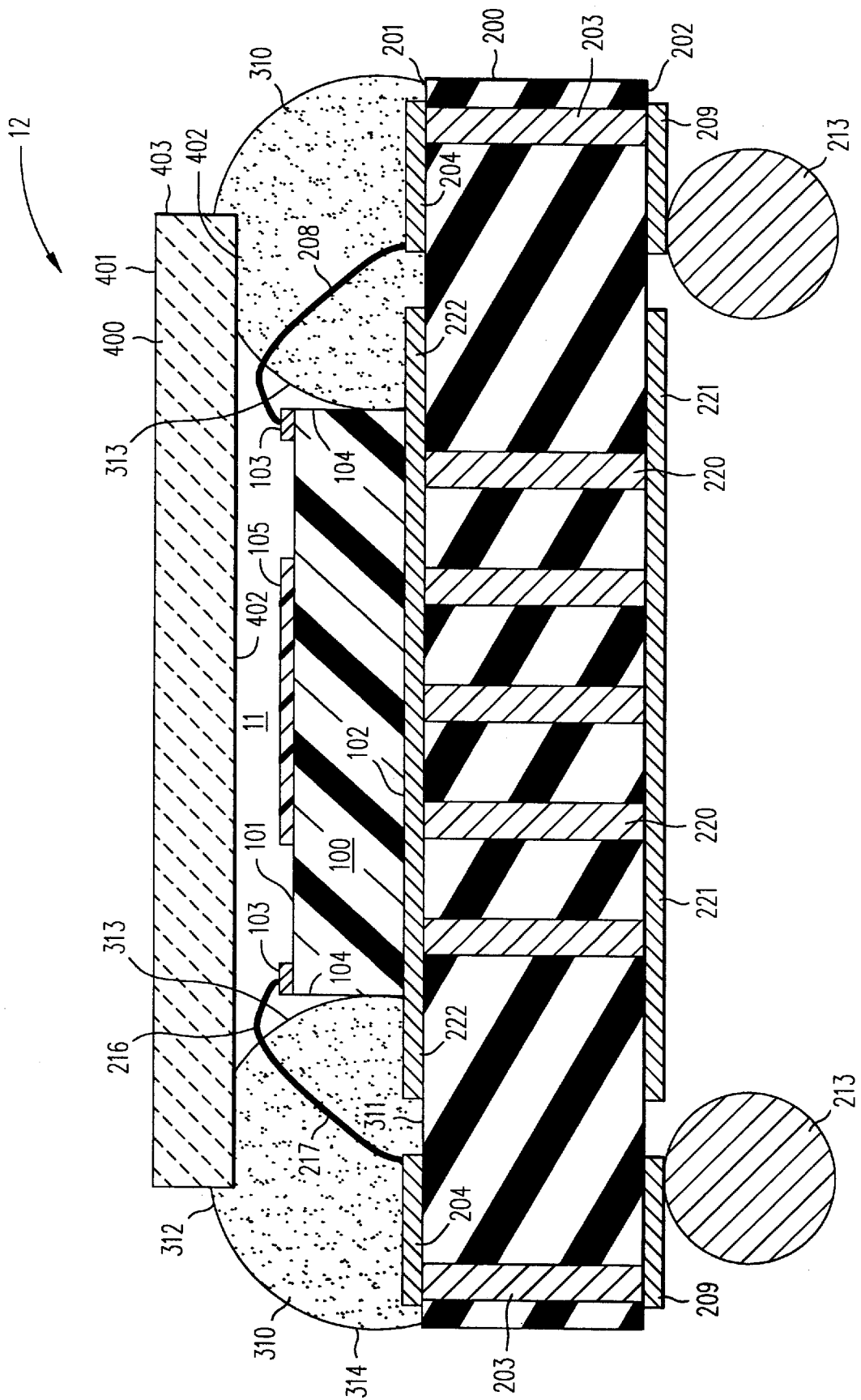
FIG. 5 is a cross sectional view of a first alternative package.

FIG. 5 is a cross-sectional view of an alternative package 12 in accordance with the present invention. Integrated circuit die 100 is contained within cavity 11 of package 12. Die 100 has a upper surface 101, a lower surface 102 which is opposite upper surface 101, and vertical side surfaces 104 at the perimeter of die 100 between upper surface 101 and lower surface 102. Die 100 also has a plurality of conductive bonding pads 103 around the perimeter of upper surface 101 of die 100.

The type of integrated circuit die 100 packaged in package 12 may vary with the application. As non-exclusive examples, die 100 may be a SAW or EPROM integrated circuit die, or a CCD or CMOS imaging integrated circuit die. Consistent with the CCD and CMOS examples, a sensing cell 105 is shown on upper surface 101 of die 100.

Substrate 200 of FIG. 5 is formed of an insulating material, such as a laminate or ceramic. Both upper surface 201 and opposite lower surface 202 of substrate 200 are generally planar. A conductive via 203 extends between upper surface 201 and lower surface 202 of substrate 200. Via 203 conducts electrical signals between bonding pads 104 of die 100 and conductive structures, such as interconnect balls 213, on lower surface 202 of substrate 200.

A thin metal die pad 222 having a perimeter is formed on upper surface 201 of substrate 200. Metal die pad 222 is formed by the same conventional masking and etching process described above for forming metalizations 204 and 209. Metal die pad 222 may be, for example, formed of copper or copper plated with gold. The shape of metal die pad 222 may be rectangular or square, depending on the shape of die 100.

Die 100 is centrally placed onto and attached to metal die pad 222 using, for example, a conventional die attach machine, such as the Alpha Sem 9006 die attach machine. Lower surface 102 of die 100 is attached to metal die pad 222 by a conventional adhesive epoxy, such as QMI 595 epoxy.

During assembly, metal die pad 222 is sized so that metal die pad 222 is larger in area than lower surface 102 of die 100. Metal die pad 222 is sized so that it extends laterally on upper surface 201 of substrate 200 a selected distance beyond each peripheral side surface 104 of die 100. For example, metal die pad 222 extends a lateral distance ranging from 0.010 to 0.020 inches beyond each side surface 104 of die 100. A benefit of having metal die pad 222 extend laterally beyond each side surface 104 of die 100 is that external moisture which may penetrate substrate 200 is blocked by metal die pad 222 from reaching cavity 11 and die 100.

Substrate 200 includes thermal vias 220, which extend through substrate 200 and conduct heat from upper surface 201 to lower surface 202 of substrate 200. By contrast, conductive vias 203 of substrate 200 conduct electrical signals to and from die 100.

For clarity, only four thermal vias 220 are shown in FIG. 5, but more may be present. Thermal vias 220 may be formed by drilling holes through substrate 200, and plating the circumferential edges of the drilled holes with metal, such as copper. Where substrate 200 is ceramic, thermal vias 220 are solid metal.

Heat sink metalization 221 is formed on lower surface 202 of substrate 200. Thermal vias 220 connect metal die pad 222 to heat sink metalization 221. Accordingly, heat generated by die 100 is conducted from lower surface 102 of die 100 to die pad 222 to thermal vias 220 and thereby to heat sink metalization 221. Heat sink metalization 221 may be formed on lower surface 202 of substrate 200 by the same conventional masking and etching process used to form metalizations 204 and 209, as described above. The size and shape of heat sink metalization 221 may vary, depending on the application. For example, heat sink metalization 221 may be square or rectangular in shape and may be the same area as die 100. As is conventionally known, metal solder may be used to thermally connect heat sink metalization 221 to a printed circuit board to dissipate heat from package 12.

Package 12 includes electrical conductors formed on upper surface 201 and lower surface 202 of substrate 200. These electrical conductors include metalizations 204 formed on upper surface 201 and metalizations 209 formed on lower surface 202 of substrate 200. Metalizations 204 and 209 are electrically connected to vias 203. Although not shown in FIG. 5, conductive contacts similar to contacts 207 and 209 of FIG. 1 are formed on the ends of metalizations 204 and 209, respectively.

In FIG. 5, solder interconnection balls 213 optionally are formed on lower surface 202 of substrate 200. Interconnection balls 213 are for physically and electrically connecting package 213, and hence die 100, to external circuitry.

Bond wires 208 electrically connect each bonding pad 103 of die 100 to a conductive contact on a metalization 204. Each bond wire 208 has a first end portion 216 that is connected to bonding pad 103 of die 100 and a second end portion 217 that is connected to the conductive contact on metalization 204 on upper surface 201 of substrate 200.

Package 12 of FIG. 5 thus includes a conductive path extending through substrate 200 for conducting signals between bonding pads 103 of die 100 and external circuitry connected to package 12 by conductive structures, such as interconnection balls 213, on second surface 202 of substrate 200. The exemplary conductive path of FIG. 5 includes bond wire 208, metalizations 204 and 209, and vias 203.

Adjacent to side surfaces 104 of die 100 is an adhesive bead 310. Bead 310 is formed on upper surface 201 of substrate 200. Bead 310 completely surrounds die 100 and contacts each of the four side surfaces 104 of die 100.

Bead 310 has a lower portion 311 which is in contact with upper surface 201 of substrate 200; an upper portion 312 which is in a press-fitted interconnection with a peripheral portion 404 of lower surface 402 of lid 400 and edge 403 of lid 400; an inner portion 313 which is in contact with a side surface 104 of die 100; and an outer portion 314 which faces away from die 100 and forms the external sidewalls of package 12. Like bead 300 of FIG. 1, bead 310 spaces lid 400 a selected distance (e.g., 0.02 to 0.04 inches) above upper surface 201 of substrate 200 and upper surface 101 of die 100. Bead 310 of FIG. 5 does not contact upper surface 101 of die 100. An example width of bead 310 is in the approximate range 0.050 inches to 0.10 inches, although the width may vary depending on the application.

Like bead 300 of FIG. 1, bead 310 of FIG. 5 is formed of an adhesive material that is viscous and flowable when it is initially applied onto upper surface 201 of substrate 200, but subsequently hardens, such as by heating at 150° C. for 60 minutes, to form a solid package sidewall that surrounds die 100. Bead 310 adheres to both upper surface 201 of substrate 200 and lid 400, and supports lid 400 above both upper surface 201 of substrate 200 and upper surface 101 of die 100.

A conventional precision bead dispenser may be used to apply bead 310 around die 100. For example, a MRSI 175-3S tool from the MRSI Company of Chelmsford, Mass. may be used. Example materials for bead 310 of FIG. 5 are the same as those for bead 300 of FIG. 1, and include epoxies, such Hysol 4451, 4323, or 4328, silicone, a blend of epoxy and silicone, or vinyl.

Lower portion 311 of bead 310 covers the peripheral portion of metal pad 222 that extends laterally on upper surface 201 beyond peripheral side surfaces 104 of die 100. Lower portion 311 of bead 310 also covers metalizations 204. By covering the exposed peripheral portions of metal pad 222 around the entire perimeter of metal die pad 222, as well as upper surface 201 of substrate 200, bead 310 helps prevent any external moisture which may penetrate substrate 200 from reaching cavity 11 and die 100.

Bead 310 also adhesively covers a major part of each bond wire 208. In particular, bead 310 envelops second end portion 217 of each bond wire 208 near metalization 204, but does not contact first end portion 216 of bond wire 208 near bonding pad 103.

As described above for package 10 of FIG. 1, package 12 of FIG. 5 includes a lid 400, which is in a press-fitted interconnection with bead 310. Lid 400 forms the top of package 12. Lid 400 has a planar upper surface 401, which forms the topmost outer surface of package 12, and an opposite planar lower surface 402, which is spaced above, centered over, and facing upper surface 101 of die 100. Lid 400 also has a peripheral edge 403 between upper surface 401 and lower surface 402. Edge 403 of lid 400 may be flat or diagonal, as shown in FIGS. 1 and 3. A peripheral portion 404 of lower surface 402 and all or part of edge 403 around the entire perimeter of package 12 is in a press-fitted interconnection with upper portion 312 of bead 310.

In an alternative embodiment, the area of lid 400 is greater than the area enclosed by bead 310. In such an example, lid 400 extends beyond outer portion 314 of bead 310, and only lower surface 402 of lid 400 is connected to bead 310.

As discussed above, the material used to form lid 400 varies with the application. For SAW integrated circuit applications, lid 400 may be formed of plastic, metal, or ceramic. For EPROM integrated circuit applications or CCD or CMOS imaging die integrated circuit applications, lid 400 may be formed of a material transparent to light, such as borosilicate glass.

Figure 6:
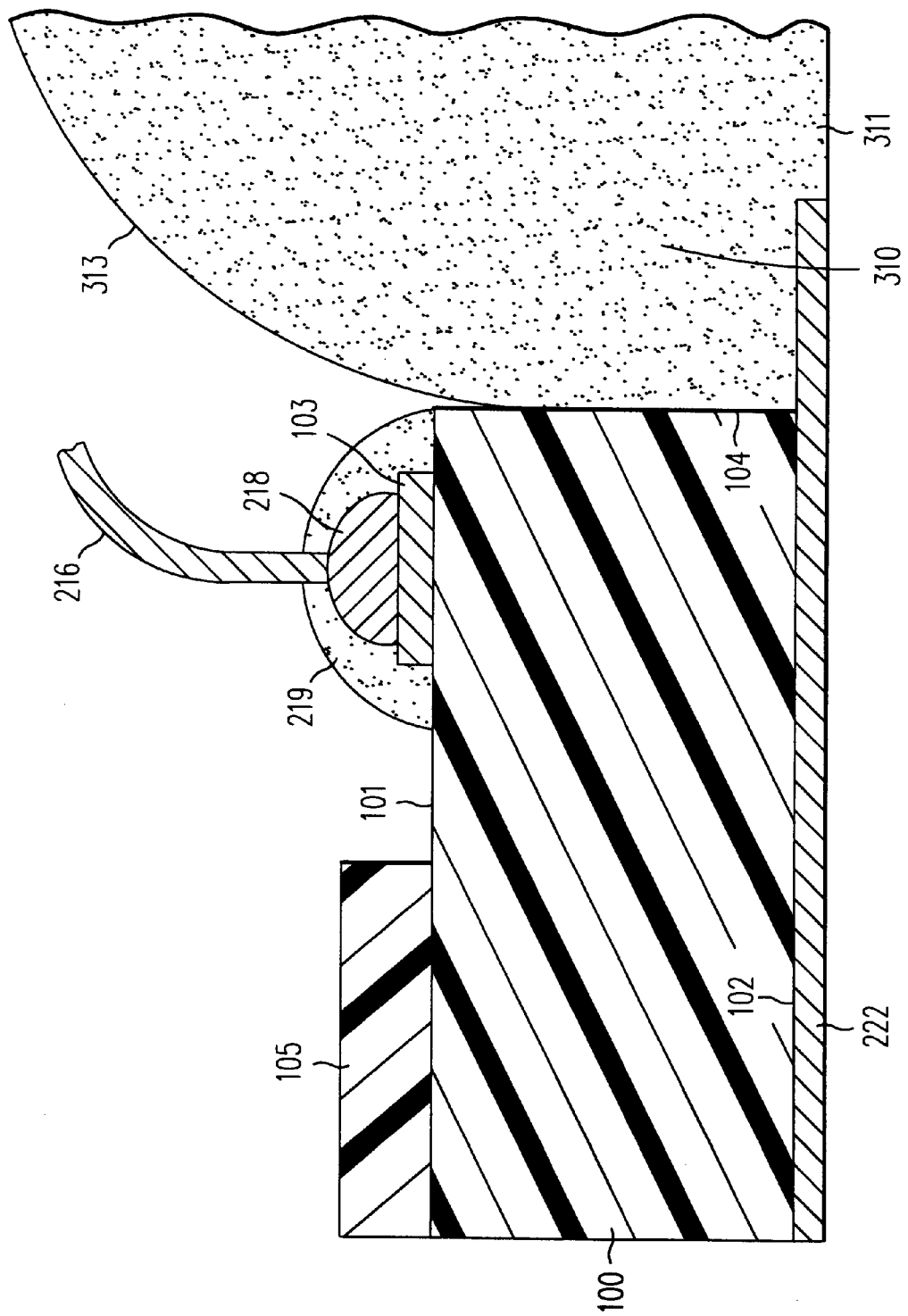
FIG. 6 is a cross sectional view of a connection between a bond wire and a bonding pad of an integrated circuit die.

FIG. 6 is a cross-sectional view of an exemplary conductive connection between a first end portion 216 of a bond wire 208 and a bonding pad 103 of die 100. Bonding pad 103 is, for example, a small square of aluminum or an aluminum alloy that is about 10,000 angstroms thick. A ball bond 218 comprised of, for example, aluminum or gold, is ultrasonically or thermosonically bonded between first end portion 216 of bond wire 208 and bonding pad 103. The connection of bond wire 208 to bonding pad 103 by ball bond 218 may be accomplished using a conventional bond wire attaching apparatus, such as the KNS 1488 or 1472 attachment machine from the KNS Company of Willow Grove, Pa.

As shown in FIG. 6, a conformal adhesive material, denoted as coating 219, covers each bonding pad 103 and ball bond 218. In alternative embodiments, coating 219 need not cover the entire height of each ball bond 218, provided that each bonding pad 103 is covered.

A purpose of adhesive coating 219 is to protect bonding pad 103 from corrosion. When initially applied, the material of coating 219 should be somewhat viscous and conformal, but should be hardenable so that a solid, protective barrier layer covers bonding pad 103. Coating 219 may be formed of the same type of material as bead 310, and may be hardened in the same manner. As an example, the material selected for coating 219 may be an epoxy material, such as Hysol 4323.

Coating 219 may be applied to bonding pad 103 by applying a drop of the selected material to each bonding pad 103 and ball bond 218 with a conventional needle dispenser. Alternatively, a continuous line of the selected adhesive material may be applied to and between each bonding pad 103 and ball bond 218 with a needle dispenser. Using this method, a line of adhesive material connects and covers each of the bonding pads 103 and ball bonds 218. In a subsequent step, coating 219 is hardened, such as by heating at 150° C. for 60 minutes. In CCD or CMOS imaging applications, as exemplified by die 100 of FIG. 5, care may be necessary in selecting and applying coating 219 to ensure that coating 219 does not contact sensing cell 105.

Figure 7:
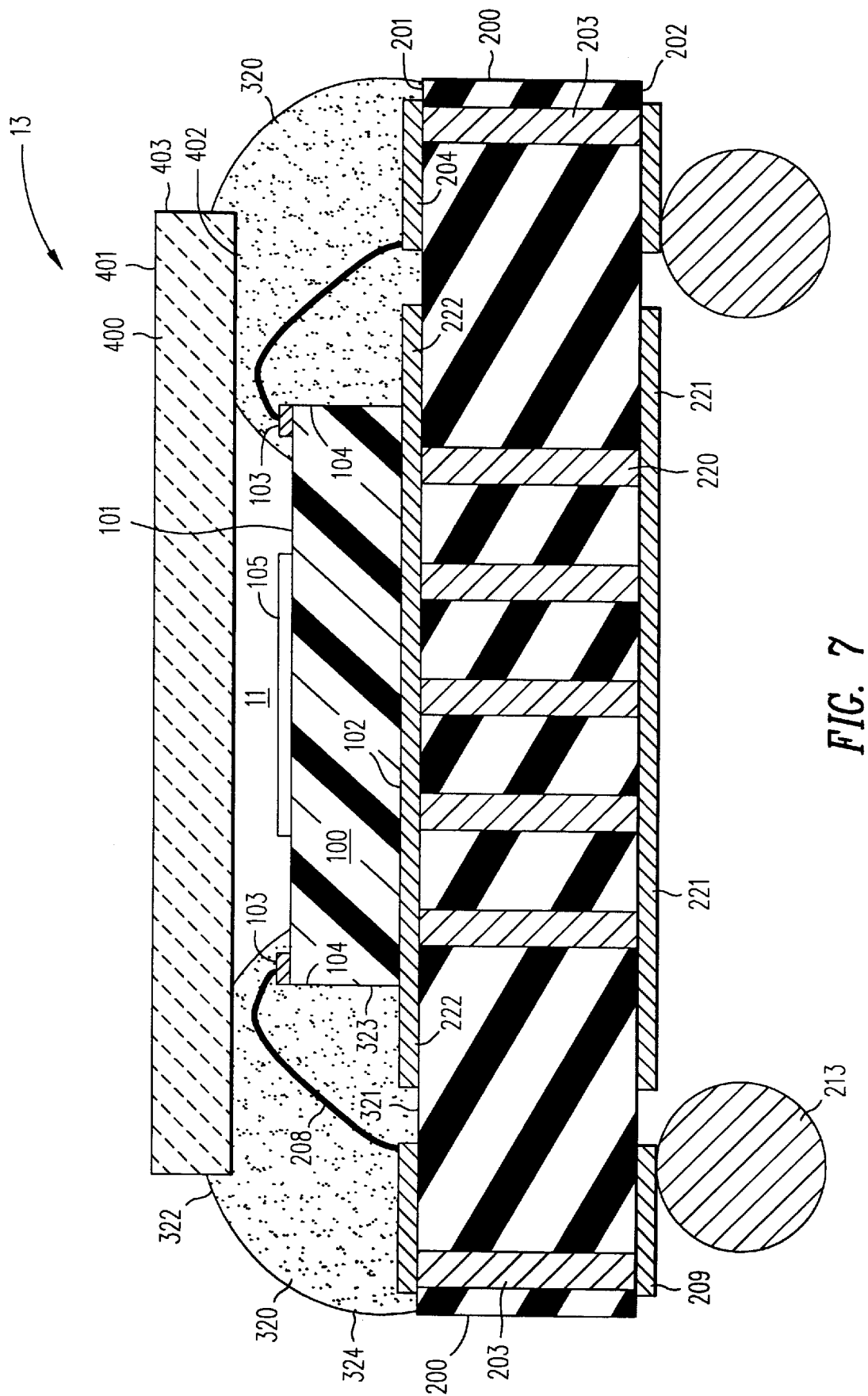
FIG. 7 is a cross sectional view of a second alternative package.

FIG. 7 is an embodiment of an alternative package 13 in accordance with the present invention. The only difference between package 12 of FIG. 5 and package 13 of FIG. 7 is the placement of the adhesive bead which surrounds integrated circuit die 100 and forms the sidewalls of package 13.

Bead 320 of FIG. 7 is formed on upper surface 201 of substrate 200. Bead 320 completely surrounds die 100, contacting the entirety of each side surface 104 around the entire perimeter of die 100.

Bead 320 of FIG. 7 has a lower portion 321 which is in contact with upper surface 201 of substrate 200; an upper portion 322 which is in a press-fitted interconnection with a peripheral portion 404 and edge 403 of lid 400; an inner portion 323 which is in contact with a side surface 104 of die 100 and covers the perimeter of upper surface 101 of die 100, including bonding pads 103 and ball bonds 218, around the entire perimeter of die 100; and, an outer portion 324 which faces away from die 100 and forms external peripheral sidewalls of package 13.

Like bead 300 of FIG. 1, bead 320 supports lid 400 a selected distance (e.g., 0.02 to 0.04 inches) above upper surface 201 of substrate 200 and upper surface 101 of die 100. In addition, bead 320 of FIG. 7 completely envelopes bond wire 208.

Lower portion 321 of bead 320 of FIG. 7 covers the portion of metal pad 222 that extends laterally on upper surface 201 of substrate 200 beyond side surfaces 104 of die 100. Lower portion 321 of bead 320 also covers metalizations 204. By covering the exposed peripheral portions of metal pad 222, as well as upper surface 201 of substrate 200, bead 320 helps prevent external moisture which may penetrate substrate 200 from reaching cavity 11 and die 100. In addition, bead 320 of FIG. 7 covers each bonding pad 103 and ball bond 218, and thus prevents corrosion of bonding pad 103.

Bead 320 of FIG. 7, like bead 300 of FIG. 1 and bead 310 of FIG. 5, is formed of an adhesive material that is viscous and flowable when it is initially applied onto upper surface 201 of substrate 200, but subsequently hardens, such as by heating at 150° C. for 60 minutes. Bead 320 form a solid package sidewall that surrounds die 100 and adheres to and separates substrate 200 and lid 400.

The example adhesive materials and methods of application described above for bead 300 of FIG. 1 and bead 310 of FIG. 5 also apply to bead 320 of FIG. 7. In CCD and CMOS imaging die applications, as exemplified by die 100, care may be necessary in selecting and applying bead 320 to ensure that the bead material does not contact sensing cell 105.

Figure 13:
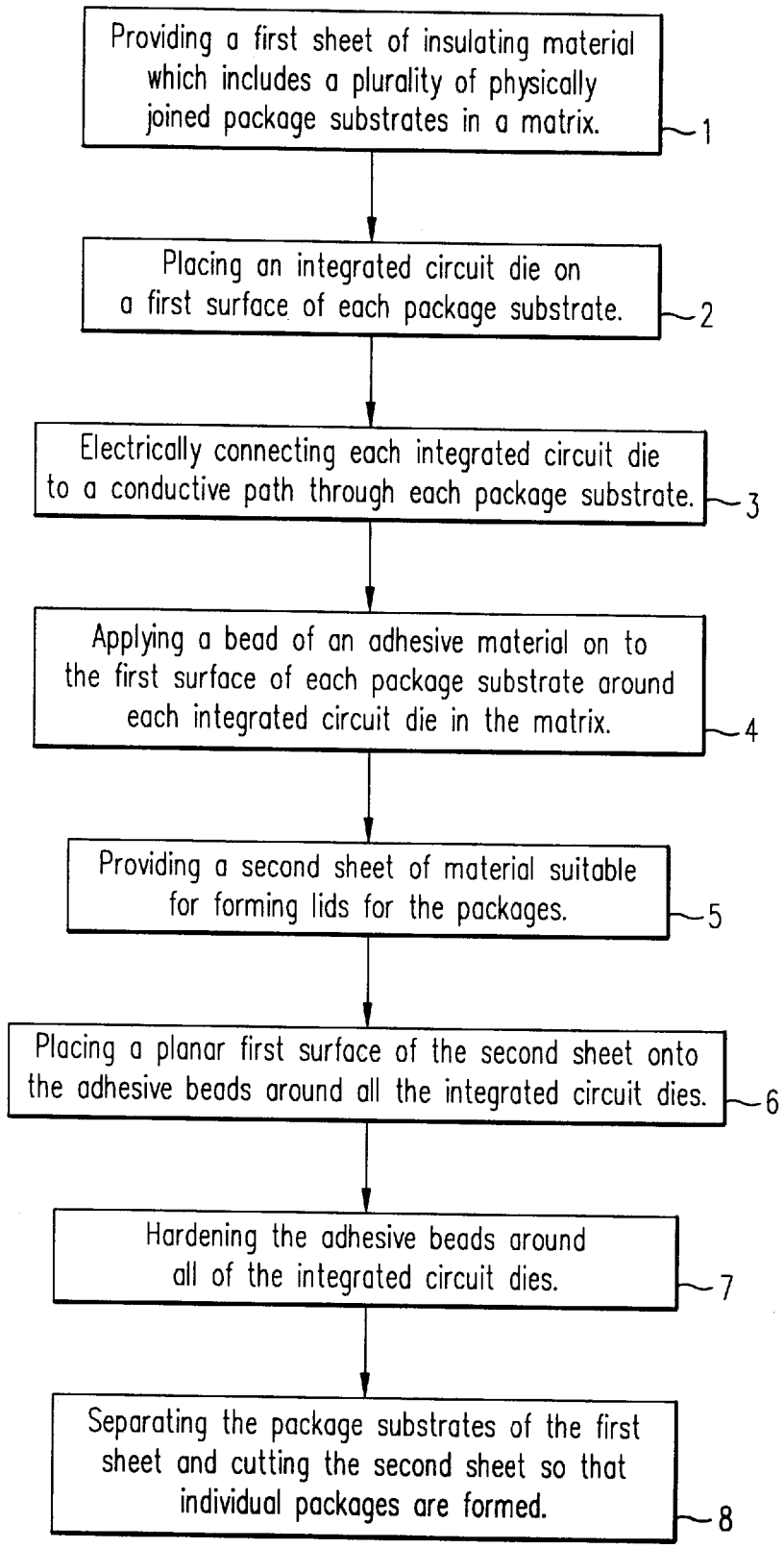
FIG. 13 is a flow chart showing a method of assembling a plurality of the package of FIG. 12.

FIG. 13 is a flow chart of an alternative method of constructing packages within the present invention. The process of FIG. 13 involves creating an array of packages on a planar sheet of an insulating substrate material which includes a plurality of physically connected package substrates 200 in a matrix, and then cutting the array apart to separate the individual packages. The number of packages in the array can vary, depending, for example, on the size of the sheet of substrate material and the area of the integrated circuit die.

Figure 8:
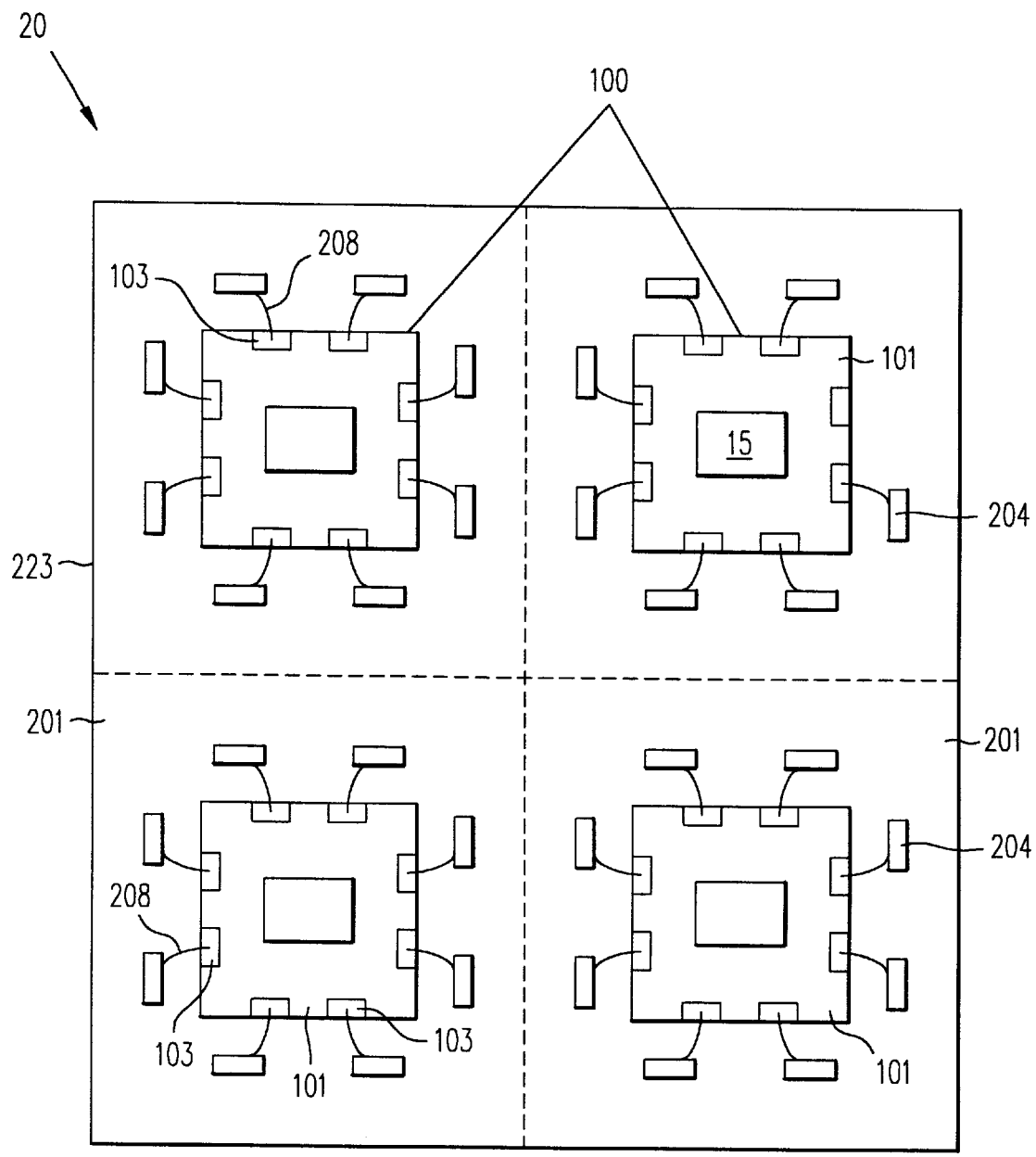
FIG. 8 is a top view of an array of incomplete packages before a step of applying an adhesive bead around each integrated circuit die of the array.

The first step of FIG. 13 is to provide a generally planar sheet 223 of insulating material, such as an epoxy laminate or ceramic, having, for example, four physically joined package substrates 200 formed in a matrix thereon. FIG. 8 is a top view of an array 20 of four incomplete packages 14 prior to a step of placing an adhesive bead around each of the four die 100 on a planar sheet 223. Dash lines delineate the boundaries of the upper surfaces 201 of each of the four package substrates 200 of substrate sheet 223 of array 20. Depending on the application, a conductive metal shorting bar (not shown) may be formed around each package substrate. During assembly, the shorting bar is electrically connected to the die to protect the die from electrostatic discharge.

Each package substrate 200 of sheet 223 of FIG. 8, like the substrates 200 of FIGS. 5 and 7 has an upper surface 201 in a common plane, a metal die pad 222, and metalizations 207. In addition, although not shown, each package substrate 200 of sheet 223 has conductive through via 203, a lower surface 202 in a common plane, metalizations 209, contacts 207 and 214, and, optionally, interconnection balls 213. As described above, metal die pad 222 is sized to extend laterally beyond the entire perimeter of die 100. Interconnection balls 223 may be formed either before or after the four exemplary packages of array 20 are separated.

A second step of FIG. 13 is to place and adhesively attach a die 100 onto each metal pad 222 of sheet 223 of FIG. 8. In particular, lower surface 102 of die 100 is attached by, for example, epoxy, to metal die pad 222. In FIG. 8, each die 100 has a sensing cell 105, as in a SAW, EPROM, CCD, or CMOS integrated circuit die, although other types of die may be used. Exemplary methods of placing and attaching a die 100 to a metal pad 222 are described above.

A third step of FIG. 13 is to electrically connect each integrated circuit die 100 to the respective conductive path through each package substrate 200 of sheet 223 of FIG. 8, and hence to conductive structure on the opposite second surface 202 of each package substrate 200. This step includes attaching bond wires 208 between each contact on metalization 204 and each bonding pad 103 of each die 100. A conventional bond wire attachment tool, such as the KNS 1488 tool described above, may be used. A fourth step of FIG. 13 is to apply an adhesive coating 219 to cover each bonding pad 103 and ball bond 218 of each die 100, as is shown in FIG. 6.

A fifth step of FIG. 13 is to apply a bead of adhesive material onto the upper surface 201 of each substrate 200 of sheet 223 around each die 100 of FIG. 8. This may be accomplished by applying beads of adhesive material in parallel columns adjacent to and between each die 100, and then applying beads of adhesive material in parallel rows adjacent to and between each die 100 and perpendicularly across the columns of beads, so that a crisscrossing pattern of columns and rows of bead material is deposited on the substrate sheet 223 around all sides of each die 100. For example, criss-crossing beads would be placed on the dash lines of FIG. 8. By this method, a single bead is applied to sheet 223 between adjacent package substrates 200 and their respective adjacent dies 100. The crisscrossing beads meld to form a continuous bead around each die 100 in array 20.

Figure 9:
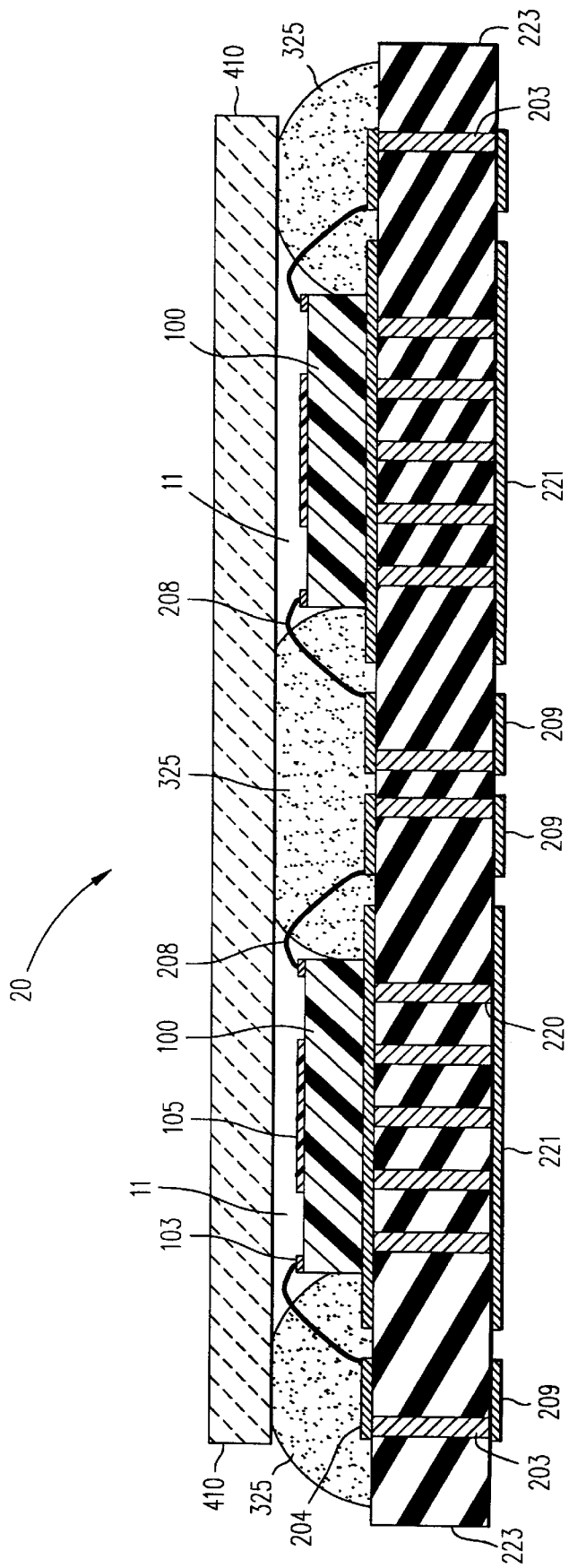
FIG. 9 is a cross sectional view of an array of incomplete packages before a step of separating the packages of the array.

FIG. 9 is a cross-sectional view of array 20 of FIG. 8 after an adhesive bead has been applied to substrate sheet 223 around each die 100 and after a sheet 410 of lid material has been centrally placed and pressed onto the crisscross pattern of adhesive beads. Three beads 325 are shown in this cross-section. Similar to bead 310 of FIG. 5, beads 325 of FIG. 9 contact each side surface 104 of each die 100, but do not cover upper surface 101 of the die 100. Beads 325 also cover each second end portion 217 of each bond wire 208 and the exposed portion of metal pad 222 that extends laterally beyond each side surface 104 of each die 100. A single bead 325 is shared between the two adjacent package substrates 200 and dies 100.

The adhesive material selected for bead 325 may vary with the application. As with bead 300 of FIG. 1, the material of bead 325 of FIG. 9 is an adhesive material (such as Hysol 4451 epoxy) that is viscous and flowable when it is initially applied onto each upper surface 201 of substrate 200 of sheet 223 of array 20, but subsequently hardens, such as by heating at 150° C. for 60 minutes. Bead 325 adheres to both substrate sheet 223 and lid sheet 420 of array 20.

The location and placement of bead 325 around each die 100 of substrate 223 of array 20 of FIG. 8 may vary with the application. For example, along the lines of FIG. 5, the bead may be placed onto upper surface 201 of each substrate 220 of sheet 223 so that the bead contacts each side surface 104 of each die 100, but does not cover upper surface 101 of die 100. Alternatively, along the lines of FIG. 7, the bead may be placed onto upper surface 201 of each substrate 200 of sheet 223 so that the bead 325 contacts each side surfaces 104 and covers a peripheral portion of upper surface 101 of each die 100, including bond wires 108, bonding pads 103, and ball bonds 218. Alternatively, along the lines of FIG. 1, the bead may be placed onto upper surface 201 of each substrate 200 of sheet 223 a selected lateral distance from each die 100.

Figure 10:
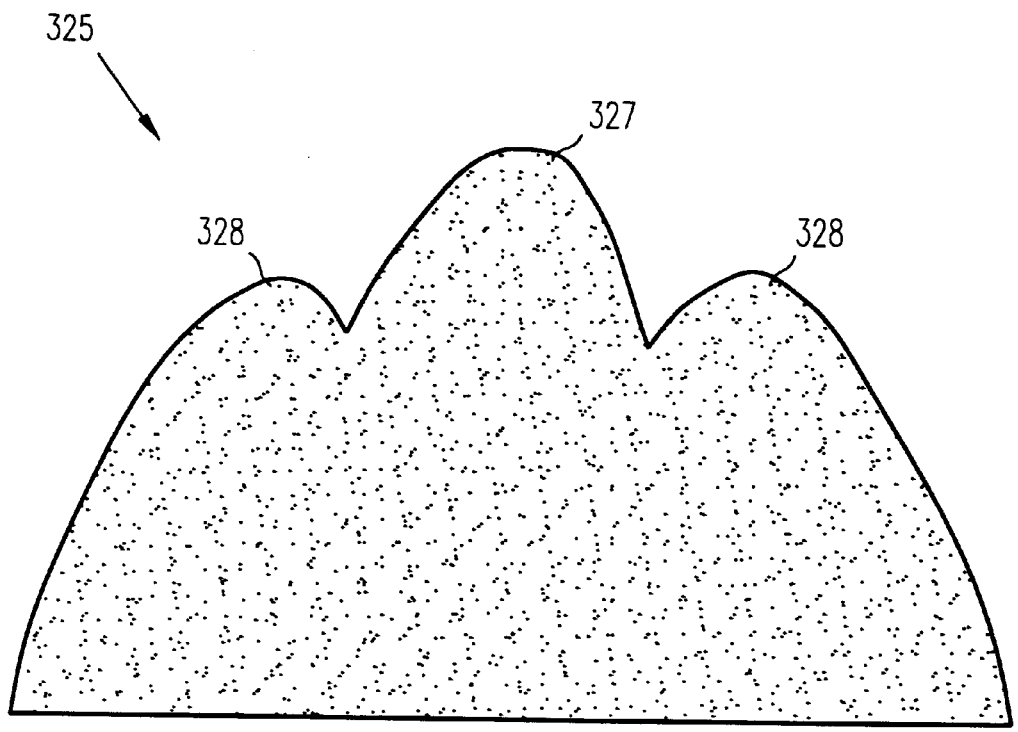
FIG. 10 is a cross sectional view of an adhesive bead.

FIG. 10 shows a cross sectional view of an embodiment of an adhesive bead 325 for array 20 prior to the step of placing a sheet 410 of lid material (see FIG. 9) onto the crisscrossing pattern of bead material. In particular, bead 325 of FIG. 10 has an upper portion which includes a dome-shaped central first peak 327 and two shorter dome-shaped second peaks 328, one adjacent to each side of first peak 327. One advantage of applying a bead with the shape shown in FIG. 10 is that, when a sheet 410 of lid material is pressed onto the bead, the width of the bead in contact with sheet 410 will be approximately the same as the width of the bead on substrate sheet 223.

Figure 11:
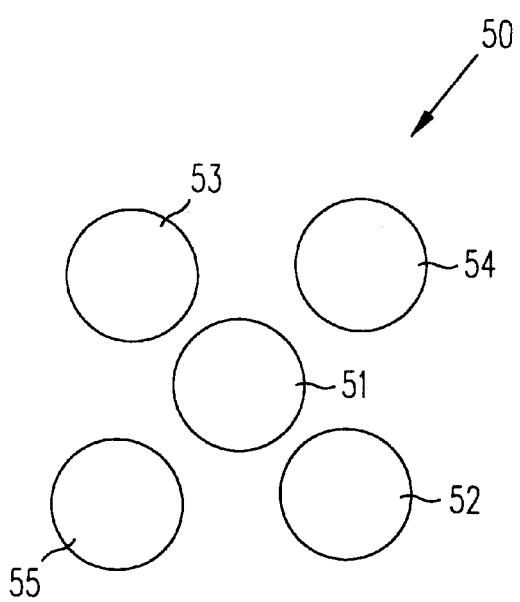
FIG. 11 is a top view of five nozzles of a custom adhesive bead dispensing tip for forming the adhesive bead of FIG. 10.

Bead 325 of FIG. 10 is applied using a conventional precision dispensing tool, such as the MRSI 175-3S tool, which has a modified dispensing tip. FIG. 11 is a top view of an example modified dispensing tip 50. The five circles of FIG. 11 represent nozzles for dispensing the adhesive material of bead 325.

Dispensing tip 50 of FIG. 11 includes a central hollow first nozzle 51. Adjacent to each side of first nozzle 51 are two smaller-diameter hollow nozzles, denoted second nozzle 52 and third nozzle 53. Also adjacent to first nozzle 51, but in a plane perpendicular to the plane of nozzles 52 and 53, are fourth nozzle 54 and fifth nozzle 55, which are also smaller in diameter than first nozzle 51. The table below provides x-y coordinates (in inches) and sizes for nozzles 51–55.

| Nozzle No. | X | Y | Nozzle Gauge |
| --- | --- | --- | --- |
| 51 | 0.000 | 0.000 | 17 Thin |
| 52 | 0.053 | 0.053 | 23 Thin |
| 53 | −0.031 | 0.031 | 21 Thin |
| 54 | −0.053 | −0.053 | 23 Thin |
| 55 | 0.031 | −0.031 | 21 Thin |

When bead material is dispensed from tip 50 of FIG. 11, the cross-sectional shape of each steam of bead material as it leaves nozzles 51–55 is circular. The parallel streams of viscous bead material exiting nozzles 51–55 meld into each other and settle into the three-peaked shape of bead 325 of FIG. 10. The height of both first peak 327 and second peak 328 of bead 325 above first surface 201 of each substrate 200 of sheet 223 exceeds the height of die 100 above first surface 201.

The height of first peak 327 of bead 325 of FIG. 10 above each first surface 201 of each substrate 200 of sheet 223 of array 20 is approximately 1.20 to 2 times the height of second peak 328 above first surface 201. Example heights for central peak 327 (before a sheet 410 of lid material is press-fitted onto beads 325) range from 0.030 to 0.050 inches above substrate sheet 223. Example heights for second peak 328 (before a sheet of lid material is pressed onto beads 325) range from 0.020 to 0.040 inches above substrate sheet 223. Example widths of bead 325 range from about 0.120 to 0.150 inches.

After the fifth step of applying a crisscrossing pattern of adhesive bead material around each die 100 on sheet 223 of array 20 (see FIG. 9), but before bead 325 hardens, a sixth step of FIG. 13 is to place a thin, lightweight, generally planar sheet 410 of material suitable for a package lid squarely onto the crisscrossed beads 325 of substrate sheet 223. During this step, the adhesive material of the upper portion of bead 325 of FIG. 10 adheres to the sheet of lid material. When array 20 is cut apart, the lid material of sheet 410 forms a lid 400 on each of the four completed packages 14 formed from array 20 (see FIG. 12).

As discussed above, FIG. 9 is a cross-sectional view of an array 20 after the placement of a sheet 410 of lid material onto beads 325. As shown, the material of beads 325 connects substrate sheet 223 to lid sheet 410, forming sealed cavities 11 around each of the four die 100 of array 20.

The material of lid sheet 410 may vary depending on the application, as described above for lid 400 of FIGS. 1, 5, and 7. For example, lid sheet 410 may be ceramic, plastic, metal, or glass. The area of lid sheet 410 should be large enough to cover each incomplete package 14 of array 20, including the adhesive beads 325 around all of the integrated circuit dies 100. The material of sheet 410 should be at least sufficiently light in weight to be temporarily supported by the still-viscous adhesive beads 325. A conventional pick and place tool, such as the MRSI 175-3S tool, can be used to place lid sheet 410 onto bead 325 of FIGS. 9 and 10. Sheet 410 will settle by force of gravity onto beads 325. Optionally, sheet 410 may be pressed onto beads 325 by hand or by using the custom pressing machine described above to increase adherence to beads 325. The sheet of lid material may be heated prior to placement upon the beads to increase adherence to the bead.

A seventh step of FIG. 13 is to harden the material of beads 325 of FIG. 9. Where epoxy material is used for beads 325, as discussed above, the epoxy bead material can be hardened by baking array 20 at 150° C. for 60 minutes. After hardening, beads 325 support lid sheet 410 above first surfaces 201 of each package substrates 200 of sheet 223 and also above first surfaces 101 of each die 100.

Subsequently, an eighth step of FIG. 13 is separating each package 14 in array 20 of FIG. 9, wherein the physically joined package substrates 200 of sheet 223 are separated, and lid sheet 410 is divided such that individual packages 14 are formed. This step may be performed, for example, by vertically cutting substrate sheet 223, lid sheet 410, and bead 325 using a conventional wafer saw, such as the KNS 98410 saw. During the cutting operation, adhesive wafer mounting tape, such as is conventionally used to hold a wafer while the wafer is cut into individual integrated circuits, may be applied to lid sheet 410 and used to hold array 20 stationary. Array 20 is inverted during the cutting step so that the wafer tape rests on a platen.

One method of cutting array 20 is to make parallel vertical cuts through the center of each column of parallel beads 325 shown in FIG. 9, and then to turn array 20 ninety degrees, and make parallel vertical cuts through the center of the rows of beads 325 which crisscross the columns of beads 325 that were originally cut. During this step, the single bead 325 shared between adjacent dies 100 and package substrates 200 of sheet 223 is split in half, such that half of the bead forms a sidewall of one package 14 and the other half forms a sidewall of a second package 14. In addition, the peripheral portions of array 200, including the peripheral edges of substrate sheet 223 and lid sheet 410 and the peripheral (unshared) beads 325 are also cut vertically, to ensure that each package 14 is the same size and that all sides of packages 14 are vertical.

Figure 12:
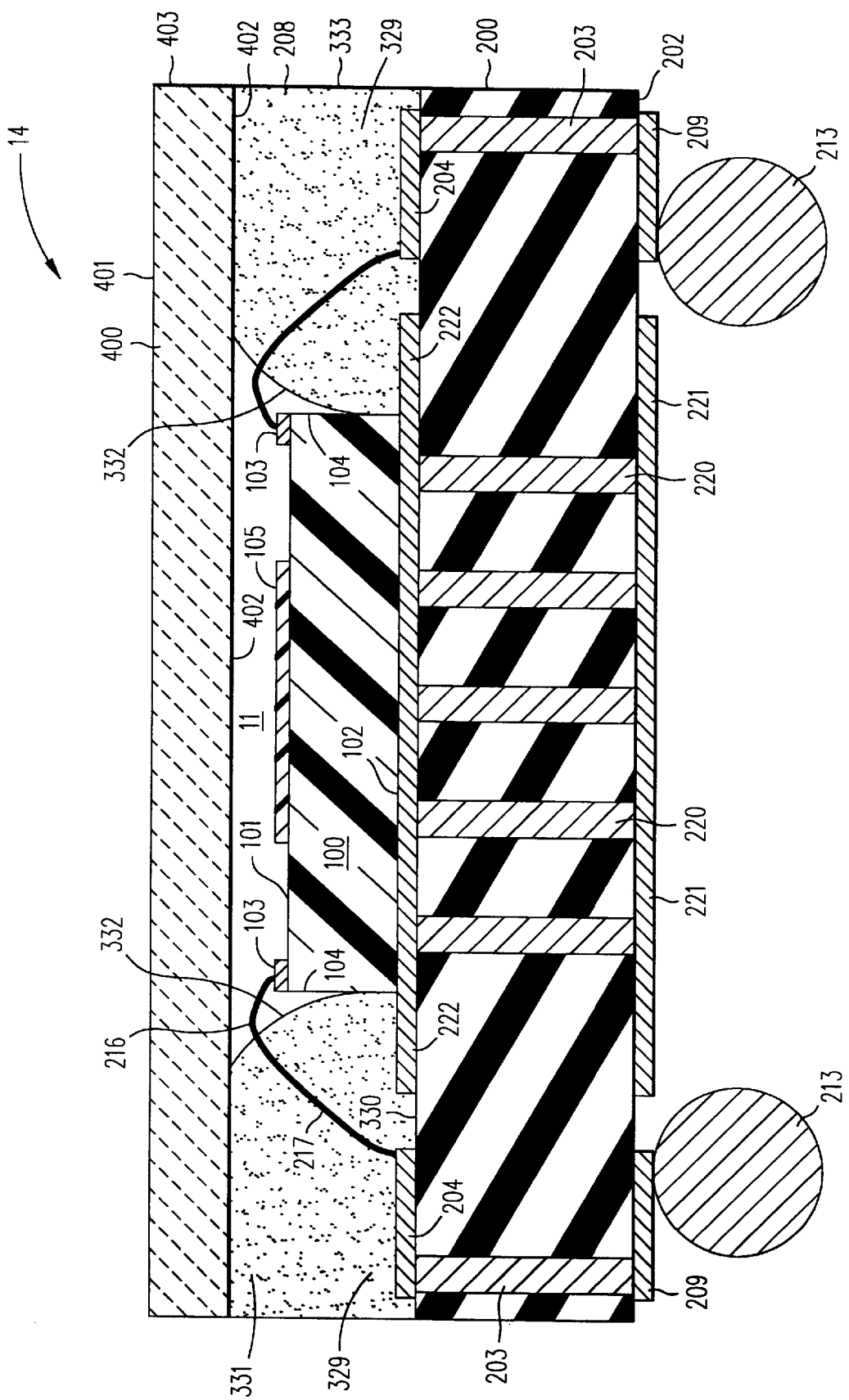
FIG. 12 is a cross sectional view of a third alternative package, which was cut from the array of FIG. 9.

FIG. 12 is a cross-sectional view of an exemplary package 14 which was cut from array 20 of FIG. 9. Like the packages of FIGS. 1, 5, and 7, package 14 has a substrate 200 as a base, a lid 400 as a package top, and a hardened adhesive bead 329 as sidewalls around cavity 11 and die 100.

Package 14 has vertical sides about its entire perimeter. The vertical sides were formed by the vertical cutting of all beads 325, lid sheet 410, and substrate sheet 223.

Each bead 329 of FIG. 12 was formed by splitting a single bead 325 of FIG. 9 vertically at its center. Bead 329 has lower portion 330 which adheres to upper surface 201 of substrate 200 and also covers metal die pad 222; an upper portion 331 which adheres to peripheral portion 404 of lower surface 402 of lid 400; an inner portion 332 which contacts side surfaces 104 of die 100 and covers second end portion 217 of bond wires 208; and, a straight outer portion 333 which was formed by the step of cutting package 14 from array 20. Outer portion 333 of bead 329 forms the straight vertical sidewalls of package 14. An example width of bead 329 is in the range of approximately 0.050 inches to 0.070 inches.

Like bead 300 of FIG. 1, bead 329 supports lower surface 401 of lid 400 a distance (e.g., 0.02–0.04 inches) above upper surface 201 of substrate 200 and die 100 and forms solid package sidewalls around die 100. Moreover, like bead 310 of FIG. 5, inner portion 332 of bead 329 of FIG. 13 contacts side surfaces 104 of die 100 and also covers second end portion 217 of each bond wire 208. Unlike packages 10, 12 and 13 of FIGS. 1, 5 and 7, respectively, lid 400 is not press-fitted into bead 325, but rather rests on upper portion 331 of bead 329. Edge 403 of lid 400 is not within bead 329.

In an alternative embodiment of package 14 along the lines of package 13 of FIG. 7, inner portion 332 of bead 329 covers side surfaces 104, the entire periphery of upper surface 101 of die 100, including bonding pads 103, and all of each bond wire 208.

The preferred and alternative embodiments described above are merely examples of the present invention. Artisans will recognize that variations are possible.

What is claimed is:

1. A package containing an integrated circuit die comprising:
   an integrated circuit die having a first surface, an opposite second surface, a first conductive structure on the die's first surface, and a perimeter;
   a planar substrate having a planar first surface and an opposite planar second surface having a second conductive structure thereon;
   an electrically conductive path which passes through the substrate and is between the first conductive structure and the second conductive structure;
   a metal die pad having a perimeter on the first surface of the substrate, wherein the second surface of the integrated circuit is on the metal die pad, and the metal die pad extends laterally beyond the entire perimeter of the integrated circuit die;
   an adhesive bead on the planar first surface of the substrate, said bead surrounding the integrated circuit die and covering a peripheral portion of the metal die pad around the entire perimeter of the metal die pad;
   a planar lid having a planar first surface; and
   wherein the planar first surface of the lid is connected to the adhesive bead around the integrated circuit die, and the planar first surface of the lid is supported above the first surface of the substrate and the integrated circuit die by the bead.

2. The package of claim 1, wherein an adhesive material covers the first conductive structure.

3. The package of claim 1, wherein the lid has a perimeter, a second surface opposite the first surface of lid, and an edge between the first and second surfaces of the lid, and the lid and at least part of the edge around the entire lid are in a press fitted interconnection with the bead.

4. The package of claim 1, wherein the package has vertical peripheral sides around the entire package.

5. The package of claim 1, wherein the adhesive bead has a width of at least approximately 0.050 inches and the lid is a one-piece structure.

6. The package of claim 1, wherein the lid is a one-piece plastic structure.

7. The package of claim 1, wherein the lid is a one-piece ceramic structure.

8. The package of claim 1, wherein the lid is a one-piece structure and is transparent to light.

9. The package of claim 1, wherein the lid is a one-piece metal structure.

10. The package of claim 1, wherein the adhesive bead contacts the integrated circuit die.

11. The package of claim 4, wherein the lid is a one-piece structure made of a material selected from metal, plastic, and ceramic.

12. The package of claim 4, wherein the lid is a one-piece structure and is transparent to light.

13. The package of claim 1, wherein the electrically conductive path includes a bond wire electrically connected to the first conductive structure, and said bond wire is covered by said adhesive bead.

14. A package containing an integrated circuit die comprising:
- an integrated circuit die having a first surface, an opposite second surface, a first conductive structure on the die's first surface, and a perimeter;
- a planar substrate having a planar first surface and an opposite planar second surface having a second conductive structure thereon;
- an electrically conductive path which passes through the substrate and is between the first conductive structure and the second conductive structure;
- an adhesive bead on the planar first surface of the substrate, said bead surrounding the integrated circuit die and covering the first conductive structure and a peripheral portion of the first surface of the integrated circuit die around the entire perimeter of the integrated circuit die;
- a lid having a planar first surface; and
- wherein the planar first surface of the lid is connected to the adhesive bead around the integrated circuit die, and the planar first surface of the lid is supported above the first surface of the substrate and the integrated circuit die by the bead.

15. The package of claim 14, wherein the lid has a perimeter, a second surface opposite the first surface of lid, and an edge between the first and second surfaces of the lid, and the lid and at least part of the edge around the entire lid are in a press-fitted interconnection with the bead.

16. The package of claim 14 wherein the package has vertical peripheral sides around the entire package.

17. The package of claim 14, wherein a metal die pad having a perimeter is on the planar first surface of the substrate;
- the second surface of the integrated circuit is placed on the metal die pad;
- the metal die pad extends laterally beyond the entire perimeter of the integrated circuit die; and
- the adhesive bead covers a peripheral portion of the metal die pad around the entire perimeter of the metal die pad.

18. The package of claim 14, wherein the adhesive bead has a width of at least approximately 0.050 inches and the lid is a planar one-piece structure.

19. The package of claim 14, wherein the lid is a one-piece plastic structure.

20. The package of claim 14, wherein the lid is a one-piece ceramic structure.

21. The package of claim 14, wherein the lid is a one-piece metal structure.

22. The package of claim 14, wherein the lid is a one-piece structure and is transparent to light.

23. The package of claim 14, wherein the electrically conductive path includes a bond wire electrically connected to the first conductive structure, and said bond wire is covered by said adhesive bead.

24. The package of claim 23, wherein the lid is a one-piece structure made of a material selected from metal, plastic, and ceramic.

25. The package of claim 23, wherein the lid is a one-piece structure and is transparent to light.

26. The package of claim 25, wherein the package has vertical peripheral sides around the entire package.

27. The package of claim 16, wherein the lid is a one-piece structure made of a material selected from metal, plastic, and ceramic.

28. The package of claim 16, wherein the lid is a one-piece structure and is transparent to light.

* * * * *

UNITED STATES PATENT AND TRADEMARK OFFICE
CERTIFICATE OF CORRECTION

PATENT NO. : 6,268,654 B1
DATED : July 31, 2001
INVENTOR(S) : Glenn, Thomas P.; Hollaway, Roy D.; Panczak, Anthony E.

It is certified that error appears in the above-identified patent and that said Letters Patent is hereby corrected as shown below:

Title page,
Item [73], please delete "Ankor" and insert -- Amkor --

Signed and Sealed this

Twenty-sixth Day of February, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,268,654 B1
DATED : July 31, 2001
INVENTOR(S) : Thomas P. Glenn, Roy D. Hollaway and Anthony E. Panczak It is certified that error appears in the above-identified patent and that said Letters Patent is hereby corrected as shown below:

Column 3,
Line 3, please delete "optionally" and insert -- Optionally --.

Signed and Sealed this

Twenty-eighth Day of January, 2003

JAMES E. ROGAN
*Director of the United States Patent and Trademark Office*